United States Patent
Tokuda

(10) Patent No.: US 9,842,179 B2
(45) Date of Patent: Dec. 12, 2017

(54) RECORDING MEDIUM, RANKING METHOD, AND INFORMATION PROCESSING DEVICE

(71) Applicant: FUJITSU LIMITED, Kawasaki-shi, Kanagawa (JP)

(72) Inventor: Kazuhiko Tokuda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/001,310

(22) Filed: Jan. 20, 2016

(65) Prior Publication Data

US 2016/0292335 A1 Oct. 6, 2016

(30) Foreign Application Priority Data

Mar. 31, 2015 (JP) ................................. 2015-073646

(51) Int. Cl.
*G06F 9/455* (2006.01)
*G06F 17/50* (2006.01)

(52) U.S. Cl.
CPC ................................ *G06F 17/5036* (2013.01)

(58) Field of Classification Search
USPC ......................................................... 716/111
See application file for complete search history.

(56) References Cited

U.S. PATENT DOCUMENTS

| 8,560,294 B1* | 10/2013 | Ren ..................... G06F 17/5036 703/14 |
| 2012/0191437 A1* | 7/2012 | Yoshimura .......... G06F 17/5036 703/14 |
| 2013/0041645 A1* | 2/2013 | Kawata ............... G06F 17/5036 703/14 |

FOREIGN PATENT DOCUMENTS

JP 2010-009475 A 1/2010

\* cited by examiner

*Primary Examiner* — Eric Lee
(74) *Attorney, Agent, or Firm* — Fujitsu Patent Center

(57) ABSTRACT

A non-transitory computer-readable recording medium having stored therein a program for causing a computer to execute a process is provided. The process includes: generating a second characteristic model from a plurality of first characteristic models by using a maximum value and a minimum value of a prescribed parameter in the plurality of first characteristic models; executing simulation by using the second characteristic model; calculating a plurality of first margins for an evaluation item according to a result of the simulation; calculating a plurality of second margins for the evaluation item with respect to each of the first characteristic models; calculating a ratio of each of the plurality of second margins to a maximum margin of the plurality at first margins; and ranking the plurality of first characteristic models according to the ratio.

9 Claims, 35 Drawing Sheets

| COMPONENT TYPE | MANUFACTURER | PRODUCT NAME | IBIS MODEL |
|---|---|---|---|
| DRAM | COMPANY X | XXXX | XXXX.ibs |
| | COMPANY Y | YYYY | YYYY.ibs |
| | COMPANY Z | ZZZZ | ZZZZ.ibs |

```
XXXX.ibs

[Pin]   sig    model      R_pin    L_pin     C_pin
N3      A0     ADDR_PIN   0.383    3.676nH   0.601pF
P7      A1     ADDR_PIN   0.325    3.323nH   0.572pF
P3      A2     ADDR_PIN   0.347    3.436nH   0.583pF
N2      A3     ADDR_PIN   0.337    3.265nH   0.593pF
P8      A4     ADDR_PIN   0.302    3.083nH   0.586pF
P2      A5     ADDR_PIN   0.316    3.136nH   0.616pF
R8      A6     ADDR_PIN   0.320    3.229nH   0.599pF
R2      A7     ADDR_PIN   0.319    3.237nH   0.596pF
T8      A8     ADDR_PIN   0.348    3.734nH   0.612pF
R3      A9     ADDR_PIN   0.311    3.092nH   0.579pF
L7      A10    ADDR_PIN   0.228    1.884nH   0.587pF
R7      A11    ADDR_PIN   0.333    3.401nH   0.599pF
N7      A12    ADDR_PIN   0.333    3.241nH   0.611pF
T3      A13    ADDR_PIN   0.326    2.454nH   0.596pF

[Model]         ADDR_PIN
Model_type      Input
Vinl  = 0.575V
Vinh  = 0.925V

C_comp            0.616pF        | 0.605pF |    | 0.643pF |

[Voltage Range]    1.500V         1.425V         1.575V
[Temperature Range]  25.0          0.0            85.0

[GND Clamp]
|     Voltage       I(typ)         I(min)         I(max)
      -1.5000e+00   -2.960249e-03  -2.777460e-03  -3.065220e-03
      -1.4900e+00   -2.931836e-03  -2.748171e-03  -3.035828e-03
      -1.4800e+00   -2.903505e-03  -2.719193e-03  -3.006487e-03

[POWER Clamp]
|     Voltage       I(typ)         I(min)         I(max)
      -1.5000e+00   2.324769e-03   2.440241e-03   2.284242e-03
      -1.4800e+00   2.244652e-03   2.362267e-03   2.203648e-03
      -1.4600e+00   2.165154e-03   2.284652e-03   2.123860e-03
```

F I G. 3

121-1

| | | | |
|---|---|---|---|
| N3 | A0 | Zo=78.2Ω | Tpd=47.0ps |
| P7 | A1 | Zo=76.2Ω | Tpd=43.6ps |
| P3 | A2 | Zo=76.8Ω | Tpd=44.8ps |
| N2 | A3 | Zo=74.2Ω | Tpd=44.0ps |
| P8 | A4 | Zo=72.5Ω | Tpd=42.5ps |
| P2 | A5 | Zo=71.4Ω | Tpd=44.0ps |
| R8 | A6 | Zo=73.4Ω | Tpd=44.0ps |
| R2 | A7 | Zo=73.7Ω | Tpd=43.9ps |
| T8 | A8 | Zo=78.1Ω | Tpd=47.8ps |
| R3 | A9 | Zo=73.1Ω | Tpd=42.3ps |
| L7 | A10 | Zo=56.7Ω | Tpd=33.3ps |
| R7 | A11 | Zo=75.4Ω | Tpd=45.1ps |
| N7 | A12 | Zo=72.8Ω | Tpd=44.5ps |
| T3 | A13 | Zo=64.2Ω | Tpd=38.2ps |

```
YYYY.ibs

[Pin]   sig    model        R_pin    L_pin      C_pin
N3      A0     ADDR_PIN     0.519    1.975nH    0.468pF
P7      A1     ADDR_PIN     0.555    2.134nH    0.527pF
P3      A2     ADDR_PIN     0.568    2.005nH    0.580pF
N2      A3     ADDR_PIN     0.602    2.077nH    0.556pF
P8      A4     ADDR_PIN     0.622    2.463nH    0.556pF
P2      A5     ADDR_PIN     0.638    2.484nH    0.573pF
R8      A6     ADDR_PIN     0.648    2.946nH    0.561pF
R2      A7     ADDR_PIN     0.697    2.800nH    0.568pF
T8      A8     ADDR_PIN     0.715    3.396nH    0.583pF
R3      A9     ADDR_PIN     0.611    2.482nH    0.551pF
L7      A10    ADDR_PIN     0.544    1.813nH    0.491pF
R7      A11    ADDR_PIN     0.589    2.763nH    0.478pF
N7      A12    ADDR_PIN     0.559    2.041nH    0.516pF
T3      A13    ADDR_PIN     0.614    2.724nH    0.536pF

[Model]       ADDR_PIN
Model_type    Input
Vinl  = 0.575V
Vinh  = 0.925V

C_comp      0.454pF      ⌐0.449pF⌐     │0.463pF│

[Voltage Range]        1.5V       1.425V       1.575V
[Temperature Range]    25         90           -10

[GND Clamp]
|    Voltage       I(typ)         I(min)         I(max)
  -1.5000e+00    -2.067176e+00   -2.217839e+00   -1.991014e+00
  -1.4773e+00    -1.959046e+00   -2.111262e+00   -1.881948e+00
  -1.4547e+00    -1.851327e+00   -2.005098e+00   -1.773285e+00

[POWER Clamp]
|    Voltage       I(typ)         I(min)         I(max)
  -1.5000e+00     2.069002e+00    2.220186e+00    1.992543e+00
  -1.4773e+00     1.960792e+00    2.113528e+00    1.883397e+00
  -1.4547e+00     1.852992e+00    2.007282e+00    1.774654e+00
```

| | | | |
|---|---|---|---|
| N3 | A0 | Zo=65.0 Ω | Tpd=30.4ps |
| P7 | A1 | Zo=63.6 Ω | Tpd=33.5ps |
| P3 | A2 | ⌞Zo=58.8 Ω⌟ | Tpd=34.1ps |
| N2 | A3 | Zo=61.1 Ω | Tpd=34.0ps |
| P8 | A4 | Zo=66.6 Ω | Tpd=37.0ps |
| P2 | A5 | Zo=65.8 Ω | Tpd=37.7ps |
| R8 | A6 | Zo=72.5 Ω | Tpd=40.7ps |
| R2 | A7 | Zo=70.2 Ω | Tpd=39.9ps |
| T8 | A8 | [Zo=76.3 Ω] | [Tpd=44.5ps] |
| R3 | A9 | Zo=67.1 Ω | Tpd=37.0ps |
| L7 | A10 | Zo=60.8 Ω | ⌞Tpd=29.8ps⌟ |
| R7 | A11 | Zo=76.0 Ω | Tpd=36.3ps |
| N7 | A12 | Zo=62.9 Ω | Tpd=32.5ps |
| T3 | A13 | Zo=71.3 Ω | Tpd=38.2ps |

```
ZZZZ.ibs

[Pin]    sig      model         R_pin      L_pin       C_pin
N3       A0       ADDR_PIN      0.103      1.600nH     0.390pF
P7       A1       ADDR_PIN      0.113      2.150nH     0.310pF
P3       A2       ADDR_PIN      0.113      2.290nH     0.310pF
N2       A3       ADDR_PIN      0.167      2.940nH     0.430pF
P8       A4       ADDR_PIN      0.134      2.410nH     0.360pF
P2       A5       ADDR_PIN      0.136      2.460nH     0.390pF
R8       A6       ADDR_PIN      0.149      2.950nH     0.340pF
R2       A7       ADDR_PIN      0.150      3.030nH     0.350pF
T8       A8       ADDR_PIN      0.164      3.290nH     0.390pF
R3       A9       ADDR_PIN      0.129      2.640nH     0.350pF
L7       A10      ADDR_PIN      0.083      1.360nH     0.320pF
R7       A11      ADDR_PIN      0.130      2.230nH     0.400pF
N7       A12      ADDR_PIN      0.102      1.530nH     0.380pF
T3       A13      ADDR_PIN      0.149      2.730nH     0.460pF

[Model]    ADDR_PIN
Model_type   Input
Vinl = 0.575V
Vinh = 0.925V

C_comp         0.670pF    |0.660pF|    |0.670pF|

[Voltage Range]     1.500V    1.425V    1.575V
[Temperature Range]  45.000   90.000    0.000

[GND Clamp]
|   Voltage       I(typ)          I(min)          I(max)
-1.500000V    -1.122940e-01    -1.204250e-01    -1.044160e-01
-1.475000V    -1.075830e-01    -1.157400e-01    -9.967400e-02
-1.450000V    -1.028830e-01    -1.110670e-01    -9.494300e-02

[POWER Clamp]
|   Voltage       I(typ)          I(min)          I(max)
-1.500000V     8.753300e-02     9.338000e-02     8.177500e-02
-1.475000V     8.397800e-02     8.984500e-02     7.819600e-02
-1.450000V     8.043000e-02     8.631800e-02     7.462500e-02
```

F I G. 7

121-3

| | | | |
|---|---|---|---|
| N3 | A0 | Zo=64.1Ω | Tpd=25.0ps |
| P7 | A1 | Zo=83.3Ω | Tpd=25.8ps |
| P3 | A2 | Zo=85.9Ω | Tpd=26.6ps |
| N2 | A3 | Zo=82.7Ω | Tpd=35.6ps |
| P8 | A4 | Zo=81.8Ω | Tpd=29.5ps |
| P2 | A5 | Zo=79.4Ω | Tpd=31.0ps |
| R8 | A6 | Zo=93.1Ω | Tpd=31.7ps |
| R2 | A7 | Zo=93.0Ω | Tpd=32.6ps |
| T8 | A8 | Zo=91.8Ω | Tpd=35.8ps |
| R3 | A9 | Zo=86.8Ω | Tpd=30.4ps |
| L7 | A10 | Zo=65.2Ω | Tpd=20.9ps |
| R7 | A11 | Zo=74.7Ω | Tpd=29.9ps |
| N7 | A12 | Zo=63.5Ω | Tpd=24.1ps |
| T3 | A13 | Zo=77.0Ω | Tpd=35.4ps |

FIG. 8

| IBIS MODEL | ITEM OF INTEREST (1) CHARACTERISTIC IMPEDANCE [Ω] | | ITEM OF INTEREST (2) PROPAGATION DELAY TIME [ps] | | ITEM OF INTEREST (3) INPUT CAPACITANCE [pF] | |
|---|---|---|---|---|---|---|
| | MINIMUM VALUE | MAXIMUM VALUE | MINIMUM VALUE | MAXIMUM VALUE | MINIMUM VALUE | MAXIMUM VALUE |
| xxxx.ibs | 56.7 | 78.2 | 33.3 | 47.8 | 0.605 | 0.643 |
| yyyy.ibs | 58.8 | 76.3 | 29.8 | 44.5 | 0.449 | 0.463 |
| zzzz.ibs | 63.5 | 93.1 | 20.9 | 35.8 | 0.660 | 0.670 |

| | ITEM OF INTEREST (1) | ITEM OF INTEREST (2) | ITEM OF INTEREST (3) |
|---|---|---|---|
| MINIMUM | 56.7 | 20.9 | 0.449 |
| MAXIMUM | 93.1 | 47.8 | 0.670 |

FIG. 10

```
[Pin]    sig       model        R_pin      L_pin       C_pin
1    Z0_min     ADDR_PIN     0.228     1.884nH     0.587pF
2    Z0_max     ADDR_PIN     0.149     2.950nH     0.340pF
3    Tpd_min    ADDR_PIN     0.083     1.360nH     0.320pF
4    Tpd_max    ADDR_PIN     0.348     3.734nH     0.612pF

[Model]      ADDR_PIN
Model_type   Input
Vinl = 0.575V
Vinh = 0.925V

C_comp            0.616pF        | 0.449pF |      | 0.670pF |

[Voltage Range]     1.500V        1.425V         1.575V
[Temperature Range] 25.0          0.0            85.0

[GND Clamp]
|    Voltage        I(typ)        I(min)         I(max)
    -1.5000e+00   -2.960249e-03  -2.777460e-03   -3.065220e-03
    -1.4900e+00   -2.931836e-03  -2.748171e-03   -3.035828e-03
    -1.4800e+00   -2.903505e-03  -2.719193e-03   -3.006487e-03

[POWER Clamp]
|    Voltage        I(typ)        I(min)         I(max)
    -1.5000e+00    2.324769e-03   2.440241e-03    2.284242e-03
    -1.4800e+00    2.244652e-03   2.362267e-03    2.203648e-03
    -1.4600e+00    2.165154e-03   2.284652e-03    2.123860e-03
```

FIG. 11

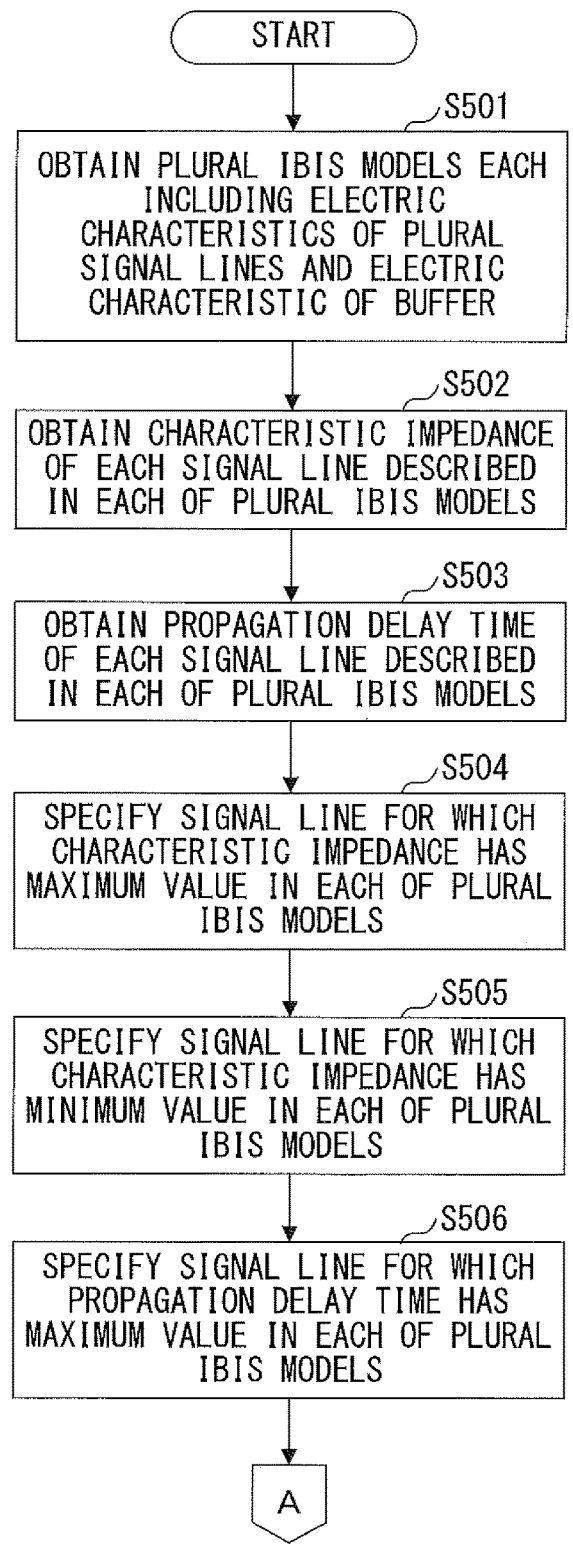
F I G. 1 2 A

| IBIS MODEL | ITEM OF INTEREST (1) | ITEM OF INTEREST (2) | ITEM OF INTEREST (3) |
|---|---|---|---|
| IBIS MODEL FOR VERIFICATION | MINIMUM | MINIMUM | MINIMUM |
| | | | MAXIMUM |
| | | MAXIMUM | MINIMUM |
| | | | MAXIMUM |
| | MAXIMUM | MINIMUM | MINIMUM |
| | | | MAXIMUM |
| | | MAXIMUM | MINIMUM |
| | | | MAXIMUM |

| | ITEM OF INTEREST (1) | ITEM OF INTEREST (2) | ITEM OF INTEREST (3) | EVALUATION ITEM (1) | EVALUATION ITEM (2) | EVALUATION ITEM (3) |
|---|---|---|---|---|---|---|
| IBIS MODEL | 56.7 | 20.9 | 0.447 | 1.5 | 1.500 | 0.351 |
| | | | 0.670 | 1.5 | 1.500 | 0.362 |
| | | 47.8 | 0.447 | 1.5 | 1.658 | 0.349 |
| | | | 0.670 | 1.5 | 1.653 | 0.363 |
| IBIS MODEL FOR VERIFICATION | 93.1 | 20.9 | 0.447 | 1.5 | 1.536 | 0.337 |
| | | | 0.670 | 1.5 | 1.522 | 0.349 |
| | | 47.8 | 0.447 | 1.5 | 1.676 | 0.366 |
| | | | 0.670 | 1.5 | 1.633 | 0.396 |

| | ITEM OF INTEREST (1) | ITEM OF INTEREST (2) | ITEM OF INTEREST (3) | MARGIN VALUE FOR EVALUATION ITEM (1) | MARGIN VALUE FOR EVALUATION ITEM (2) | MARGIN VALUE FOR EVALUATION ITEM (3) |
|---|---|---|---|---|---|---|
| IBIS MODEL | 56.7 | 20.9 | 0.447 | 0.3 | 0.400 | 0.049 |
| | | | 0.670 | 0.3 | 0.400 | 0.038 |
| | | 47.8 | 0.447 | 0.3 | 0.242 | 0.051 |
| | | | 0.670 | 0.3 | 0.247 | 0.037 |
| IBIS MODEL FOR VERIFICATION | 93.1 | 20.9 | 0.447 | 0.3 | 0.364 | 0.063 |
| | | | 0.670 | 0.3 | 0.378 | 0.051 |
| | | 47.8 | 0.447 | 0.3 | 0.224 | 0.034 |
| | | | 0.670 | 0.3 | 0.267 | 0.004 |

F I G. 1 8

|  | (2)min-(3)min | (2)min-(3)max | (2)max-(3)min | (2)max-(3)max | MAXIMUM MARGIN VALUE IN CHARACTERISTIC TABLE |
|---|---|---|---|---|---|
| ITEM OF INTEREST(1) EVALUATION ITEM(1) | 0.300 | 0.300 | 0.300 | 0.300 | 0.300 |
| ITEM OF INTEREST(1) EVALUATION ITEM(2) | 0.379 | 0.387 | 0.231 | 0.247 | 0.400 |
| ITEM OF INTEREST(1) EVALUATION ITEM(3) | 0.049 | 0.038 | 0.041 | 0.018 | 0.063 |

|  | (2)min-(3)min | (2)min-(3)max | (2)max-(3)min | (2)max-(3)max | MAXIMUM MARGIN VALUE IN CHARACTERISTIC TABLE |
|---|---|---|---|---|---|
| ITEM OF INTEREST(2) EVALUATION ITEM(1) | 0.300 | 0.300 | 0.300 | 0.300 | 0.300 |
| ITEM OF INTEREST(2) EVALUATION ITEM(2) | 0.242 | 0.247 | 0.224 | 0.267 | 0.4 |
| ITEM OF INTEREST(2) EVALUATION ITEM(3) | 0.050 | 0.037 | 0.037 | 0.004 | 0.063 |

|  | (2)min-(3)min | (2)min-(3)max | (2)max-(3)min | (2)max-(3)max | MAXIMUM MARGIN VALUE IN CHARACTERISTIC TABLE |
|---|---|---|---|---|---|
| ITEM OF INTEREST(3) EVALUATION ITEM(1) | 0.300 | 0.300 | 0.300 | 0.300 | 0.300 |
| ITEM OF INTEREST(3) EVALUATION ITEM(2) | 0.400 | 0.246 | 0.374 | 0.254 | 0.400 |
| ITEM OF INTEREST(3) EVALUATION ITEM(3) | 0.039 | 0.039 | 0.052 | 0.008 | 0.063 |

FIG. 24

|  | (2)min-(3)min | (2)min-(3)max | (2)max-(3)min | (2)max-(3)max |
|---|---|---|---|---|
| ITEM OF INTEREST(1) EVALUATION ITEM(1) | 100 | 100 | 100 | 100 |
| ITEM OF INTEREST(1) EVALUATION ITEM(2) | 95 | 97 | 58 | 62 |
| ITEM OF INTEREST(1) EVALUATION ITEM(3) | 78 | 60 | 65 | 28 |

|  | (2)min-(3)min | (2)min-(3)max | (2)max-(3)min | (2)max-(3)max |
|---|---|---|---|---|
| ITEM OF INTEREST(2) EVALUATION ITEM(1) | 100 | 100 | 100 | 100 |
| ITEM OF INTEREST(2) EVALUATION ITEM(2) | 61 | 62 | 56 | 67 |
| ITEM OF INTEREST(2) EVALUATION ITEM(3) | 79 | 59 | 54 | 6 |

|  | (2)min-(3)min | (2)min-(3)max | (2)max-(3)min | (2)max-(3)max |
|---|---|---|---|---|
| ITEM OF INTEREST(3) EVALUATION ITEM(1) | 100 | 100 | 100 | 100 |
| ITEM OF INTEREST(3) EVALUATION ITEM(2) | 100 | 61 | 93 | 64 |
| ITEM OF INTEREST(3) EVALUATION ITEM(3) | 62 | 61 | 83 | 12 |

F I G. 2 5

| IBIS MODEL | SUM OF DETERMINATION POINTS | RANK |
|---|---|---|
| XXXX.ibs | 2723 | 3 |
| YYYY.ibs | 2838 | 1 |
| ZZZZ.ibs | 2798 | 2 |

RECORDING MEDIUM, RANKING METHOD, AND INFORMATION PROCESSING DEVICE

CROSS-REFERENCE TO RELATED APPLICATION

This application is based upon and claims the benefit of priority of the prior Japanese Patent Application No. 2015-073646, filed on Mar. 31, 2015, the entire contents of which are incorporated herein by reference.

FIELD

The embodiments discussed herein are related to a recording medium, a ranking method, and an information processing device.

BACKGROUND

A technology for simulating a transmission line by using an I/O Buffer Information Specification (IBIS) model describing electric characteristics such as an input or output of a semiconductor component has been put into practice.

A user verifies an action of a semiconductor component by observing a waveform of a signal propagated through a transmission line obtained by a transmission line simulation. Examples of the semiconductor component include an Integrated Circuit (IC) and a Large-Scale Integration (LSI). The IC or LSI may be a semiconductor memory such as a Dynamic Random Access Memory (DRAM), a Static Random Access Memory (SRAM), or a flash memory. The IC or LSI may be a Central Processing Unit (CPU), a multicore CPU, a Field Programmable Gate Array (FPGA), or a Programmable Logic Device (PLD).

When there are a plurality of IBIS models for elements having a specification similar to each other, a simulation device simulates a transmission line by using each of the plurality of IBIS models so as to determine waveform quality and obtain delay data. As described above, there is a problem wherein the number of simulations of a transmission line increases as the number of IBIS models increases.

In order to deal with this problem, a technology has been proposed for reducing the number of simulations by generating an IBIS model for verification that includes the characteristics of a plurality of IBIS models and performing simulation using the IBIS model for verification.

A user desires to select an element of an IBIS model having a large margin for evaluation items as an element to be loaded onto a product in order to obtain a produce having fewer malfunctions. However, it is impossible to specify which IBIS model has a large margin only by performing simulation using the IBIS model for verification, and it is difficult to determine which element of the elements of the plurality of IBIS models may be selected.

Further, in simulations using respective IBIS models, as an example, when the first, second, and third IBIS models respectively have the largest margins for the first, second, and third evaluation items, it is difficult to determine which element of the elements of the first, second, and third IBIS models may be selected.

Furthermore, the document such as Japanese Laid-open Patent Publication No. 2010-9475 is well known.

SUMMARY

According to an aspect of the invention, a non-transitory computer-readable recording medium having stored therein a program for causing a computer to execute a process is provided. The process includes: generating a second characteristic model from a plurality of first characteristic models by using a maximum value and a minimum value from among maximum values and minimum values of a prescribed parameter in the respective plurality of first characteristic models, the plurality of first characteristic models respectively describing electric characteristics of a plurality of semiconductor components; executing simulation by using the second characteristic model; calculating a plurality of first margins for an evaluation item according to a result of the simulation; calculating a plurality of second margins for the evaluation item with respect to each of the first characteristic models by using a maximum value and a minimum value of the prescribed parameter in each of the plurality of first characteristic models; calculating a ratio of each of the plurality of second margins to a maximum margin of the plurality of first margins; and ranking the plurality of first characteristic models according to the ratio.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2 illustrates information relating to input IBIS models.

FIG. 3 illustrates the description content of an IBIS model.

FIG. 4 illustrates characteristic impedances and propagation delay times that correspond to respective signal lines.

FIG. 5 illustrates the description content of an IBIS model.

FIG. 6 illustrates characteristic impedances and propagation delay times that correspond to respective signal lines.

FIG. 7 illustrates the description content of an IBIS model.

FIG. 8 illustrates characteristic impedances and propagation delay times that correspond to respective signal lines.

FIG. 9 illustrates a maximum value and a minimum value of each parameter in each of the IBIS models.

FIG. 10 illustrates a maximum value and a minimum value of each parameter in a plurality of IBIS models.

FIG. 11 illustrates the description content of an IBIS model for verification.

FIG. 12A is a flowchart of a ranking process according to an embodiment.

FIG. 13 illustrates a list of conditions used in a simulation.

FIG. 17 is a table describing values of evaluation items under respective simulation conditions.

FIG. 18 is a table describing margin values for evaluation items under respective simulation conditions.

FIG. 24 illustrates a margin value, used for a determination point under each condition.

FIG. 25 illustrates a determination point under each condition.

FIG. 26 illustrates the total of determination points and a rank of each IBIS model.

DESCRIPTION OF EMBODIMENTS

Embodiments are described below with reference to the drawings.

Figure 1:
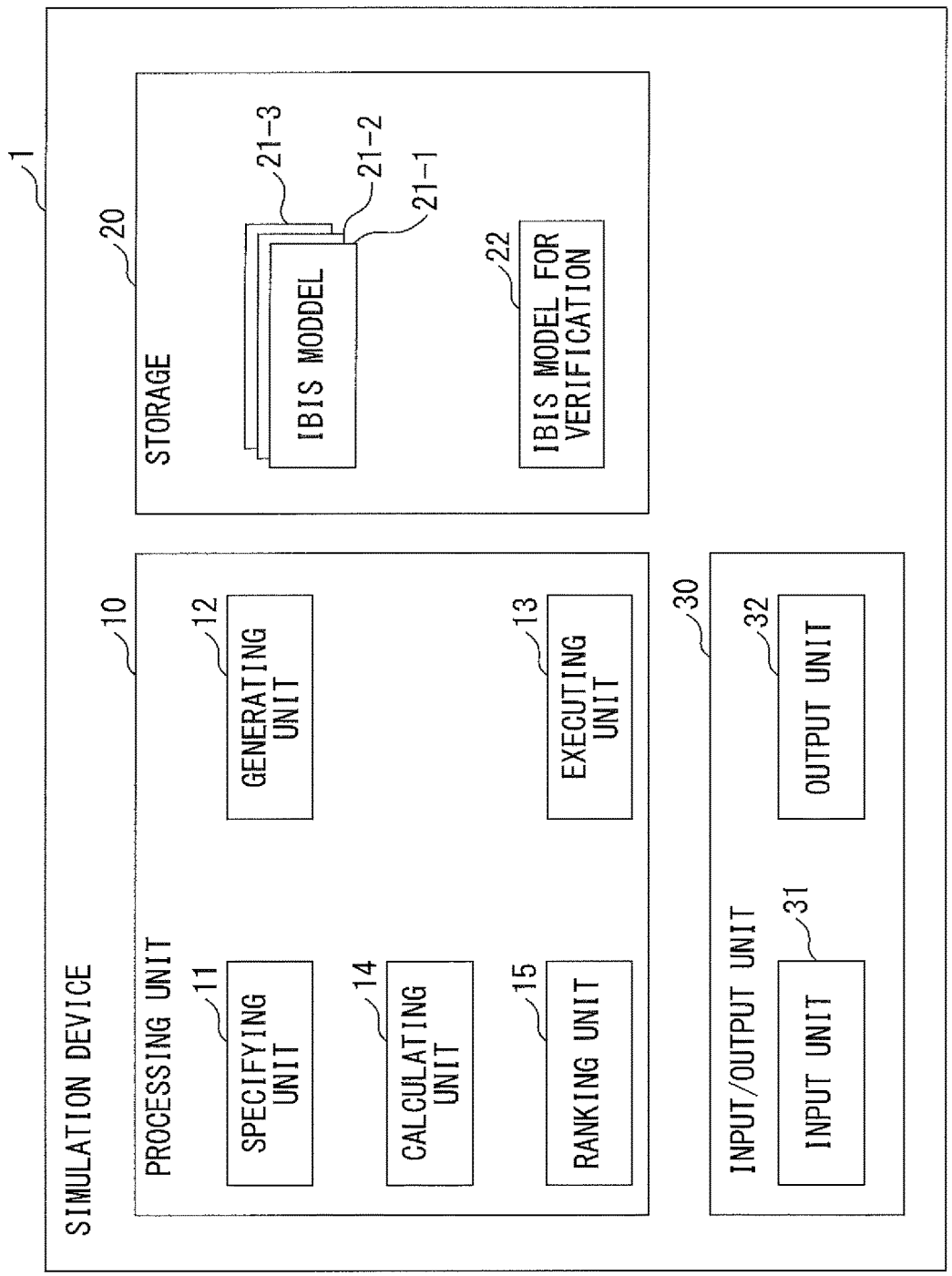
FIG. 1 illustrates a configuration of a simulation device according to an embodiment.

FIG. 1 illustrates a configuration of a simulation device according to an embodiment.

A simulation device 1 includes a processing unit 10, a storage 20, and an input/output unit 30. The simulation device 1 is, for example, a computer such as a personal computer (PC) or a server. The simulation device 1 is an example of an information processing device.

The processing unit 10 includes a specifying unit 11, a generating unit 12, an executing unit 13, a calculating unit 14, and a ranking unit 15.

The storage 20 stores an IBIS model 21-$i$ ($i$=1 to 3) and an IBIS model for verification 22. The storage 20 may store a plurality of IBIS models for verification 22. The IBIS model 21-$i$ is, for example, an IBIS model input into the simulation device 1 via an input unit 31. The IBIS model 21-$i$ is an example of the first characteristic model. The IBIS model for verification 22 is, for example, an IBIS model for verification generated by the generating unit 12 in the generating process described later. The IBIS model for verification 22 is an example of the second characteristic model.

The input/output unit 30 includes an input unit 31 and an output unit 32.

The specifying unit 11 specifies the first signal line for which a prescribed parameter has a maximum value, and the second signal line for which the prescribed parameter has a minimum value in the IBIS model 21-$i$ describing electric characteristics for respective plural signal lines of a semiconductor component. The signal line refers, for example, to a wiring from a pin to a die pad in a package included in a semiconductor component.

Examples of the electric characteristic of a signal line include a resistance value of the signal line, a capacitance value of the signal line, and an inductance value of the signal line. The prescribed parameter of the signal line may be, for example, a characteristic impedance of the signal line. In his case, the specifying unit 11 obtains a characteristic impedance Z0 for each of the plural signal lines by using a capacitance value C and an inductance value L according to the following expression (1).

$$Z0=\sqrt{(L/C)} \qquad (1)$$

The prescribed parameter of the signal line may be, for example, a propagation delay time of a signal propagated through the signal line. In this case, the specifying unit 11 obtains a propagation delay time Tpd for each of the plural signal lines by using a capacitance value C and an inductance value L according to the following expression (2).

$$Tpd=\sqrt{(L/C)} \qquad (2)$$

When a plurality of IBIS models 21-$i$ respectively generated for a plurality of semiconductor components are input, the specifying unit 11 specifies the first signal line for which a prescribed parameter has a maximum value, and the second signal line for which the prescribed parameter has a minimum value, in the plurality of IBIS models 21-$i$.

The specifying unit 11 further specifies a maximum value and a minimum value of a prescribed electric characteristic in the IBIS model 21-$i$ describing electric characteristics of a buffer. The buffer refers, for example, to an output buffer of a driver, or an input buffer of a receiver in an IBIS model. In the description below, the output buffer of the driver is also referred to simply as a "driver". The input buffer of the receiver is also referred to simply as a "receiver". Examples of the prescribed electric characteristic of the buffer include an input capacitance of a receiver, an output current voltage characteristic of a driver, and a ramp rate of an output of a driver.

When a plurality of IBIS models 21-$i$ respectively generated for a plurality of semiconductor components, the plurality of IBIS models 21-$i$ each describing electric characteristics of a buffer, are input, the specifying unit 11 specifies a maximum value and a minimum value of the input capacitance of the receiver in the plurality of the IBIS models 21-$i$.

When a plurality of IBIS models 21-$i$ respectively generated for a plurality of semiconductor components, the plurality of IBIS models 21-$i$ each describing electric characteristics of a buffer, are input, the specifying unit 11 may specify the first buffer and the second buffer in the plurality of IBIS models 21-$i$. The first buffer is, for example, a driver for which the first parameter obtained by using the electric characteristics has a maximum value. The second buffer is, for example, a driver for which the second parameter obtained by using the electric characteristics has a minimum value.

The first parameter and the second parameter may be, for example, output impedances of a driver that are obtained by using the output current voltage characteristic of the driver. The specifying unit 11 may obtain the first parameter by using a minimum, value of the output current voltage characteristic for each of a plurality of drivers into which the IBIS models 21-$i$ have been input. Further, the specifying unit 11 may obtain the second parameter by using a maximum value of the output current voltage characteristic for each of the plurality of drivers into which the IBIS models 21-$i$ have been input.

The first parameter and the second parameter may be, for example, a transition time of an output of a driver obtained by using a ramp rate of the output of the driver. The specifying unit 11 may obtain the first parameter by using a minimum value of the ramp rate for each of the plurality of drivers into which the IBIS models 21-$i$ have been respectively input. Further, the specifying unit 11 may obtain the second parameter by using a maximum value of the ramp rate for each of the plurality of drivers into which the IBIS models 21-$i$ have been respectively input. The transition time is, for example, a rise time or a fall time of the output of the driver.

The generating unit 12 generates an IBIS model for verification describing electric characteristics of some signal lines, including the first signal line and the second signal line that have been specified by the specifying unit 11, among a plurality of signal lines.

When the specifying unit 11 specifies the maximum value and the minimum value of the input capacitance of the receiver in the plurality of IBIS models 21-$i$, the generating unit 12 also generates an IBIS model for verification describing the specified maximum value and minimum value of the input capacitance by using the IBIS models 21-$i$.

The generating unit 12 further generates an IBIS model for verification describing an electric characteristic that corresponds to the first parameter of the first buffer specified by the specifying unit 11 and an electric characteristic that corresponds to the second parameter of the second buffer specified by the specifying unit 11, by using the IBIS models 21-$i$.

The executing unit 13 simulates a transmission line by using the IBIS model for verification 22 generated by the generating unit 12. The executing unit 13 also simulates the transmission line by using the maximum value and the minimum value of the prescribed electric characteristic specified by the specifying unit 11. Examples of the prescribed electric characteristic include an input capacitance of a receiver, an output current voltage characteristic of a driver, and a ramp rate of a driver.

The calculating unit 14 calculates a margin value used for a determination point and the determination point for each of the IBIS models 21-$i$ on the basis of simulation results.

The ranking unit 15 ranks the IBIS models 21-$i$ on the basis of the calculated determination points. The input unit 31 receives, for example, an input of the IBIS model 21-$i$.

The output unit 32 outputs, for example, the IBIS model for verification generated by the generating unit 12, and the results of the simulation of the transmission line performed by the executing unit 13 to respective devices.

In the description below, it is assumed that the IBIS model 21-$i$ is an IBIS model input by a user. It is also assumed that the IBIS model for verification 22 is an IBIS model used for verification. The IBIS model 21-$i$ is not limited to the IBIS model input by a user, but the IBIS model 21-$i$ may be an IBIS model that has been stored in the storage 20.

According to the embodiments, when a semiconductor component is used for a receiver, a single IBIS model for verification is generated on the basis of IBIS models of a plurality of semiconductor components, and transmission lines connected to the semiconductor components are simulated.

The embodiments are described under the assumption that the plurality of semiconductor components are DRAMs. It is also assumed that the simulation device 1 simulates a transmission line connected to an address pin in each of the DRAMs. In this case, it is assumed that the address pin is a pin of a package. In the embodiments, wirings between address pins and die pads in the plurality of semiconductor components are respectively referred to as signal lines A0 to A13.

A process of generating the IBIS model for verification 22 on the basis of IBIS models 21-1 to 21-3 is now described.

FIG. 2 illustrates information relating to input IBIS models. FIGS. 3, 5, and 7 illustrate the description content of the IBIS models.

A description is given with reference to FIG. 3.

In the simulation of a transmission line, when IBIS models including information 201 illustrated in FIG. 2 are input, the specifying unit 11 references the content of the IBIS model 21-1 having the file name "XXXX.ibs" illustrated in FIG. 3. As illustrated in FIG. 2, the IBIS model 21-1 is an IBIS model for which a component type is a Dynamic Random Access Memory (DRAM) a manufacturer is Company X, a product name is XXXX, and a file name is XXXX.ibs.

The specifying unit. 11 references the section [Model] in the IBIS model 21-1, and specifies a maximum value surrounded with a solid line, and a minimum value surrounded with a broken line of the input capacitance C_comp of the receiver.

The specifying unit 11 further references the section [Pin] in the IBIS model 21-1, and calculates characteristic impedances of the signal lines A0-A13 by using capacitance values and inductance values that respectively correspond to the signal lines A0-A13 according to Expression (1). The specifying unit 11 also references the section [Pin] in the IBIS model 21-1, and calculates propagation delay times of the respective signal lines by using the capacitance values and the inductance values that respectively correspond to the signal lines A0-A13 according to Expression (2). A calculated value 121-1 (the characteristic impedances and the propagation delay times of the respective signal lines) obtained by the specifying unit 11 is illustrated in FIG. 4.

The specifying unit 11 references the calculated value 121-1, and extracts a maximum value surrounded with a solid line and a minimum value surrounded with a broken line of the characteristic impedance. The specifying unit 11 further references the calculated value 121-1, and extracts a maximum value surrounded with a solid line and a minimum value surrounded with a broken line of the propagation delay time.

A description is given with reference to FIG. 5.

The specifying unit 11 then references the content of an IBIS model 21-2 having the file name "YYYY.ibs" illustrated in FIG. 5. As illustrated in FIG. 2, the IBIS model 21-2 is an IBIS model for which a component type is a DRAM, a manufacturer is Company Y, a product name is YYYY, and a file name is YYYY.ibs.

The specifying unit 11 references the section [Model] in the IBIS model 21-2, and specifies a maximum value surrounded with a solid line and a minimum value surrounded with a broken line of the input capacitance C_comp of the receiver.

The specifying unit 11 further references the section [Pin] in the IBIS model 21-2, and calculates characteristic impedances of the signal lines A0-A13 by using capacitance values and inductance values that respectively correspond to the single lines A0-A13 according to Expression (1). The simulation device 1 references the section [Pin] In the IBIS model 21-2, and calculates propagation delay times of the respective signal lines by using the capacitance values and the inductance values that respectively correspond to the signal lines A0-A13 according to Expression (2). A calculated value 121-2 (the characteristic impedances and the propagation delay times of the respective signal lines) obtained by the specifying unit 11 is illustrated in FIG. 6.

The specifying unit 11 references the calculated value 121-2, and extracts a maximum value surrounded with a solid line and a minimum value surrounded with a broken line of the characteristic impedance. The specifying unit 11 further references the calculated value 121-1, and extracts a maximum value surrounded with a solid line and a minimum value surrounded with a broken line of the propagation delay time.

A description is given with reference to FIG. 7.

The specifying unit 11 further references the content of an IBIS model 21-3 having the file name "ZZZ.ibs" illustrated in FIG. 7. As illustrated in FIG. 2, the IBIS model 21-3 is an IBIS model for which a component type is a DRAM, a manufacturer is Company Z, as product name is ZZZZ, and a file name is ZZZZ.ibs.

The specifying unit 11 references the section [Model] in the IBIS model 21-3, and specifies a maximum value surrounded with a solid like and a minimum value surrounded with a broken line of the input capacitance C_comp of the receiver.

The specifying unit 11 further references the section [Pin] in the IBIS model 21-3, and calculates characteristic impedances of the signal lines A0-A13 by using capacitance values and inductance values that respectively correspond to the signal lines A0-A13 according to Expression (1). The specifying unit 11 also references the section [Pin] in the IBIS model 21-3, and calculates propagation delay times of the signal lines A0-A13 by using the capacitance values and the inductance values that respectively correspond to the signal lines A0-A13 according to Expression (2) A calculated value 121-3 (the characteristic impedances and the propagation delay times of the respective signal lines) obtained by the specifying unit 11 is illustrated in FIG. 8.

The specifying unit 11 references the calculated value 121-3, and extracts a maximum value surrounded with a solid line and a minimum value surrounded with a broken line of the characteristic impedance. The specifying unit 11 further references the calculated value 121-3, and extracts a maximum value surrounded with a solid line and a minimum value surrounded by a broken line of the propagation delay time.

An extracted value 301 (the maximum value and the minimum value of the characteristic impedance, the maximum value and the minimum value of the propagation delay time, and the maximum value and the minimum value of the input capacitance) that the specifying unit 11 has obtained from the IBIS models 21-1 to 21-3 are illustrated in FIG. 9. FIG. 9 illustrates the maximum value and the minimum value of the characteristic impedance, the maximum value and the minimum value of the propagation delay time, and the maximum value and the minimum value of the input capacitance in each of the IBIS models 21-1 to 21-3.

Hereinafter, the characteristic impedance, the propagation delay time, and the input capacitance are also referred to as an "item of interest (1)", an "item of interest (2)", and an "item of interest (3)", respectively. In addition, the characteristic impedance, the propagation delay time, and the input capacitance are also referred to as "parameters".

The specifying unit 11 references the extracted value 301, and specifies a maximum value surrounded with a solid line and a minimum value surrounded with a broken line of the characteristic impedance, and a maximum value surrounded with a solid line and a minimum value surrounded with a broken line of the propagation delay time in the IBIS models 21-1 to 21-3. The specifying unit 11 further references the extracted value 301, and specifies a maximum value surrounded with a solid line and a minimum value surrounded with a broken line of the input capacitance in the IBIS models 21-1 to 21-3. The specified maximum values and minimum values of the respective items of interest (1)-(3) in the IBIS models 21-1 to 21-3 (a maximum/minimum value 311) are illustrated in FIG. 10.

The specifying unit 11 specifies signal lines that respectively correspond to the maximum value and the minimum value of the characteristic impedance that have been searched for by using the maximum/minimum value 311. The specifying unit 11 also specifies signal lines that respectively correspond to the maximum value and the minimum value of the propagation delay time that have been searched for by using the maximum/minimum value 311.

The generating unit 12 generates an IBIS model for verification 22 describing the electric characteristics of the specified signal lines, and the specified input capacitance values.

FIG. 11 illustrates the description content of an IBIS model for verification.

An example of a process in which the generating unit 12 generates the IBIS model for verification 22 is described below with reference to FIG. 11. In the description below, assume that the IBIS model for verification 22 is generated by changing descriptions in the sections [Pin] and [Model] of the IBIS model 21-1, as illustrated in FIG. 11. The generating unit 12 may generate the IBIS model for verification 22 by rewriting another IBIS model instead of the IBIS model 21-1.

The specifying unit 11 searches for a minimum value of the values of the characteristic impedance of a plurality of signal lines for which electric characteristics are described in the IBIS models 21-1 to 21-3, by using the extracted value 301. The specifying unit 11 further specifies the signal line A10 in the IBIS model 21-1 that corresponds to the searched for minimum value of the characteristic impedance. The generating unit 12 describes, in the IBIS model for verification 22, electric characteristics that correspond to the specified signal line A10 in the IBIS model 21-1 in association with the signal line Z0_min.

The specifying unit 11 searches for a maximum value of the values of the characteristic impedance of a plurality of signal lines for which electric characteristics are described in the IBIS models 21-1 to 21-3, by using the extracted value 301. The specifying unit 11 further specifies the signal line A6 in the IBIS model 21-3 that corresponds to the searched for maximum value of the characteristic impedance. The generating unit 12 describes, in the IBIS model for verification 22, electric characteristics that correspond to the specified signal line A6 in the IBIS model 21-3 in association with the signal line Z0_max.

The specifying unit 11 then searches for a minimum value of the values of the propagation delay time of a plurality of signal lines for which electric characteristics are described in the IBIS models 21-1 to 21-3, by using the extracted value 301. The specifying unit 11 further specifies the signal line A10 in the IBIS model 21-3 that corresponds to the searched for minimum value of the propagation delay time. The generating unit 12 describes, in the IBIS model for verification 22, electric characteristics that correspond to the specified signal line A10 in the IBIS model 21-3 in association with the signal line Tpd_min.

The specifying unit 11 further searches for a maximum value of the values of the propagation delay time of a plurality of signal lines for which electric characteristics are described in the IBIS models 21-1 to 21-3, by using the extracted value 301. The specifying unit 11 further specifies the signal line A8 in the IBIS model 21-1 that corresponds to the searched for maximum value of the propagation delay time. The generating unit 12 describes, in the IBIS model for verification 22, electric characteristics that correspond to the specified signal line A8 in the IBIS model 21-1 in association with the signal line Tpd_max. The generating unit 12 may describe electric characteristics, for example, of a signal line specified by a user in the IBIS model for verification 22.

The generating unit 12 also describes a maximum value and a minimum value of the input capacitance C_comp that have been specified by referencing the extracted value 301, in association with the input capacitance C_comp in the IBIS model for verification 22. The generating unit 12 may only describe the maximum value and the minimum value of the input capacitance C_comp that have been specified by referencing the extracted value 301, in association with the input capacitance C_comp in the IBIS model for verification 22.

As a result of the above process, the generating unit 12 generates the IBIS model for verification 22.

Figure 12B:
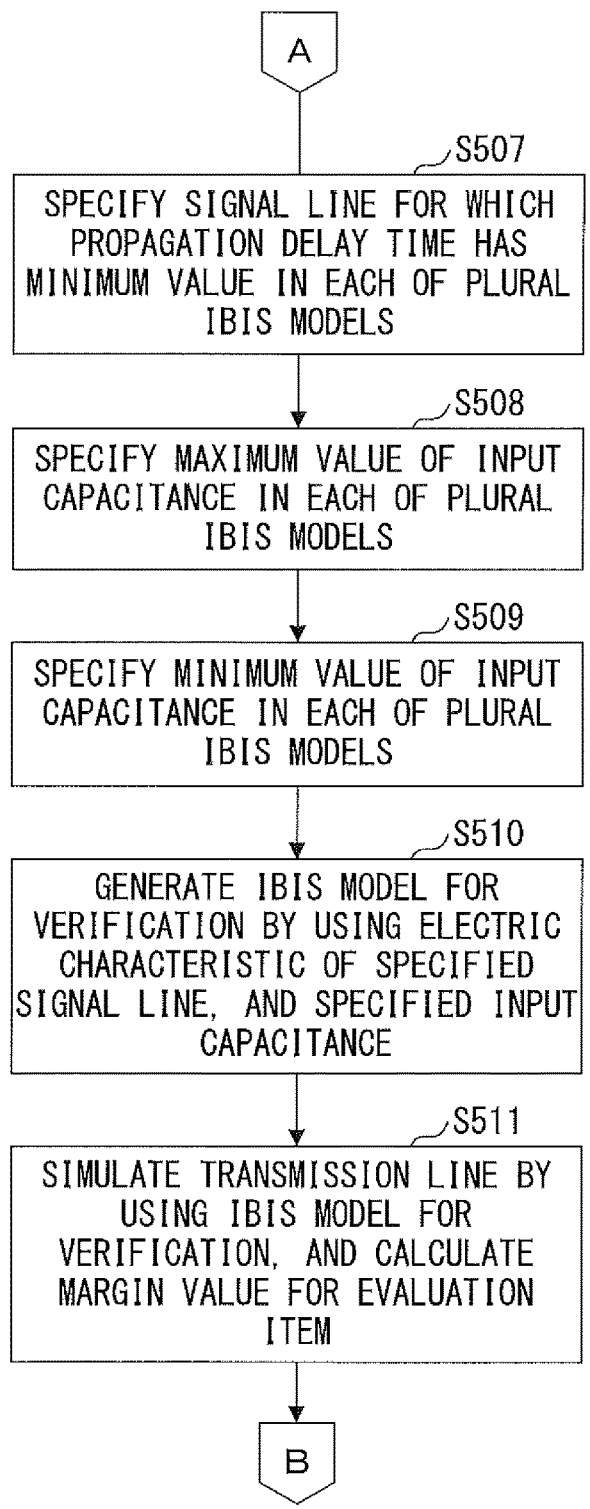
FIG. 12B is a flowchart of a ranking process according to an embodiment.
Figure 12C:
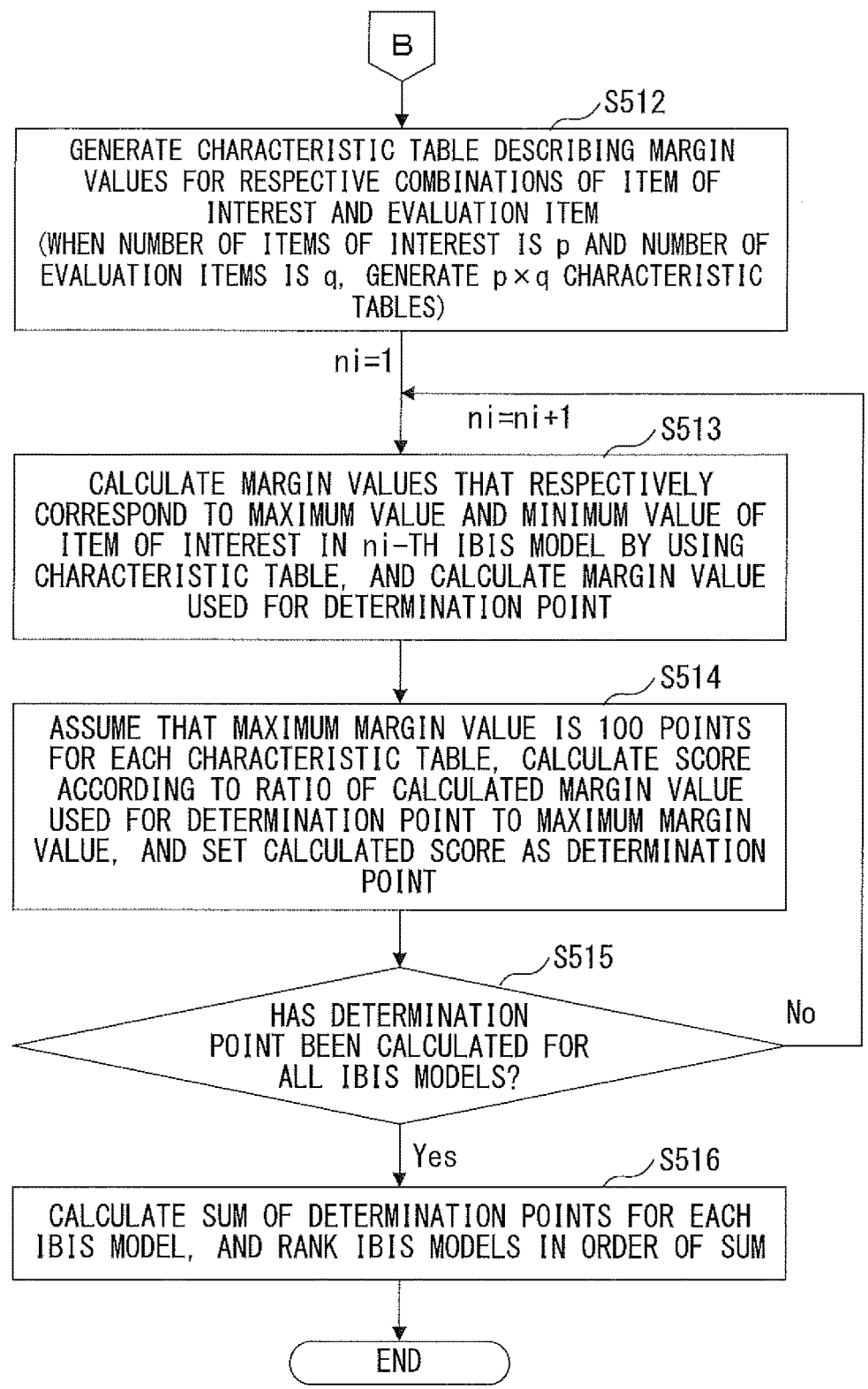
FIG. 12C is a flowchart of a ranking process according to an embodiment.

FIGS. 12A to 12C are flowcharts of a ranking process according to the embodiments.

In step S501, the specifying unit 11 obtains a plurality of IBIS models 21-1 to 21-3 that each include the electric characteristics of a plurality of signal lines, and the electric characteristics of a buffer.

In step S502, the specifying unit 11 obtains characteristic impedances of respective signal lines described in each of the plurality of IBIS models 21-1 to 21-3. Here, the specifying unit 11 calculates the characteristic impedance according to Expression (1) by using a capacitance value C and an inductance value L described in the IBIS model, for example, for each of the signal lines.

In step S503, the specifying unit 11 obtains propagation delay times of the respective signal lines described in each of the plurality of IBIS models 21-1 to 21-3. Here, the specifying unit 11 calculates a propagation delay time Tpd according to Expression (2) by using the capacitance value C and the inductance value L described in the IBIS model, for example, for each of the signal lines.

In step S504, the specifying unit 11 references the obtained characteristic impedances of the respective signal lines, and specifies a signal line for which the characteristic impedance has a maximum value in the plurality of IBIS models 21-1 to 21-3.

In step S505, the specifying unit 11 references the obtained characteristic impedances of the respective signal lines, and specifies a signal line for which the characteristic impedance has a minimum value in the plurality of IBIS models 21-1 to 21-3.

In step S506, the specifying unit. 11 references the obtained propagation delay times of the respective signal lines, and specifies a signal line for which the propagation delay time has a maximum value in the plurality of IBIS models 21-1 to 21-3.

In step S507, the specifying unit 11 references the obtained propagation delay times of the respective signal lines, and specifies a signal lines for which the propagation delay time has a minimum value in the plurality of IBIS models 21-1 to 21-3.

In step S508, the specifying unit 11 specifies a maximum value of an input capacitance in the plurality of IBIS models 21-1 to 21-3.

In step S509, the specifying unit 11 specifies a minimum value of the input capacitance in the plurality of IBIS models 21-1 to 21-3.

In step S510, the generating unit 12 generates the IBIS model for verification 22 by using the electric characteristics of the specified signal lines, and the specified input capacitance values.

In step S511, the executing unit 13 simulates a transmission line by using the IBIS model for verification 32. The executing unit 13 executes simulation by using, as a condition, all combinations of the maximum value and the minimum value of the characteristic impedance the item of interest (1)), the maximum value and the minimum value of the propagation delay time (the item of interest (2)), and the maximum value and the minimum value of the input capacitance (the item of interest (3)).

Figure 14:
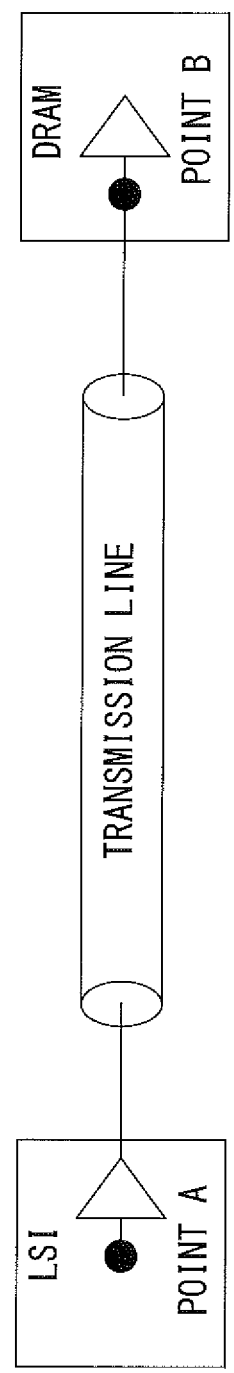
FIG. 14 illustrates a topology-based simulation of a transmission line.

FIG. 13 illustrates a list of conditions used in a simulation. In the embodiments, the number of items of interest is three, and therefore the executing unit 13 executes simulation under 8 (=2^3) conditions, as illustrated in FIG. 13. In the embodiments, the executing unit 13 executes a topology-based simulation for a transmission line, as illustrated in FIG. 14. Assume that an LSI is a driver, and that a DRAM is a receiver. A result of a simulation under a condition is illustrated in FIGS. 15 and 16.

Figure 15:
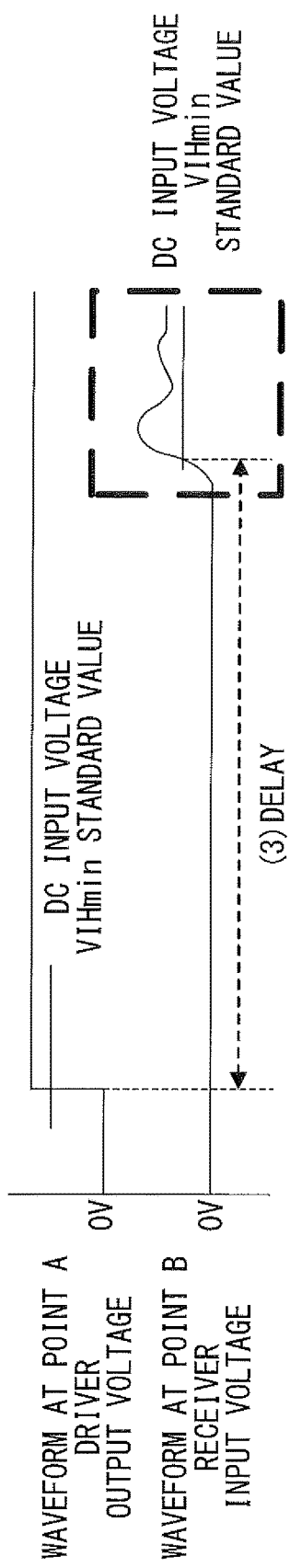
FIG. 15 illustrates a voltage waveform of each unit.

FIG. 15 illustrates a voltage waveform of each unit.

A voltage waveform on the upper side of FIG. 15 represents an output voltage at a point A of the driver (LSI) and a voltage waveform on the lower side of FIG. 15 represents an input voltage at a point B of the receiver (DRAM).

Figure 16:
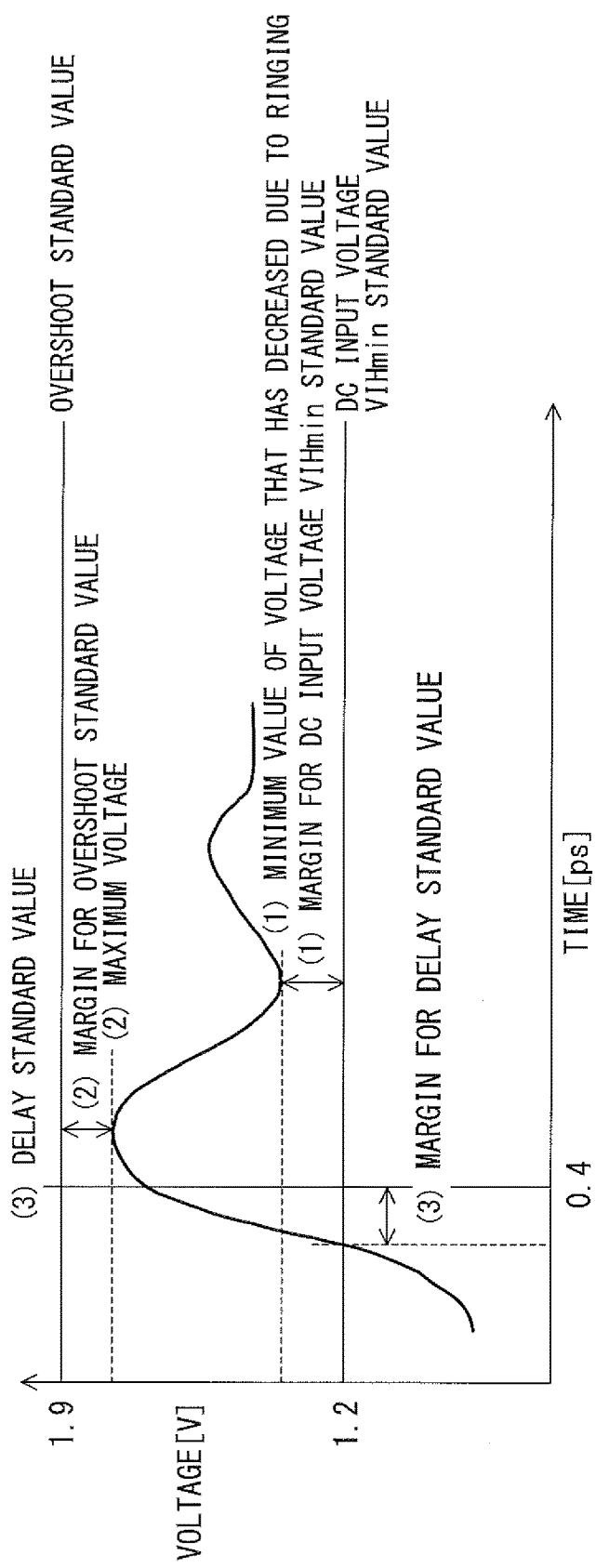
FIG. 16 is an enlarged view of a broken-line portion in FIG. 15.

FIG. 16 is an enlarged view of a broken-line portion in FIG. 15.

In the embodiments, evaluation items (1) to (3) are as described below.

Evaluation item (1) a minimum value of a voltage that decreases due to a ringing The minimum value of the voltage that decreases due to a ringing is a minimum value of an input voltage that decreases due to a ringing after an input voltage of the DRAM exceeds a standard value (a VIHmim standard value).

Evaluation item (2): a maximum voltage

The maximum voltage is a maximum value of the input voltage of the DRAM.

Evaluation item (3): a delay

The delay is a time period after the output voltage of the LSI exceeds the standard value (the VIHmim standard value) and before the input voltage of the DRAM exceeds the standard value (the VIHmim standard value).

A table describing values of the evaluation items (1) to (3) under respective simulation conditions is illustrated in FIG. 17.

Assume that the standard values (thresholds) of the evaluation items (1) to (3) are 1.2, 1.9, and 0.4, respectively.

The calculating unit 14 calculates differences; between, the values of the evaluation items (1) to (3) and the standard values so as to calculate a margin value fox the evaluation item (1) to a margin value for the evaluation item (3). The margin value for the evaluation item (1) is positive when the value of the evaluation item (1) is greater than the standard value, and the margin values for the evaluation items (2) and (3) are positive when the values of the evaluation items (2) and (3) are less than the standard values. A table describing the margin value for the evaluation item (1) to the margin value for the evaluation item (3) under respective simulation conditions is illustrated in FIG. 18.

In step S512, the calculating unit 14 generates a margin value characteristic table for each combination of an item of interest and a margin value for an evaluation item. When the number of items of interest is p, and the number of evaluation items is q, p×q characteristic tables are generated.

The generated characteristic tables and corresponding graphs are illustrated in FIGS. 19A-19C, 20A-20C, and 21A-21C.

Figure 19A:
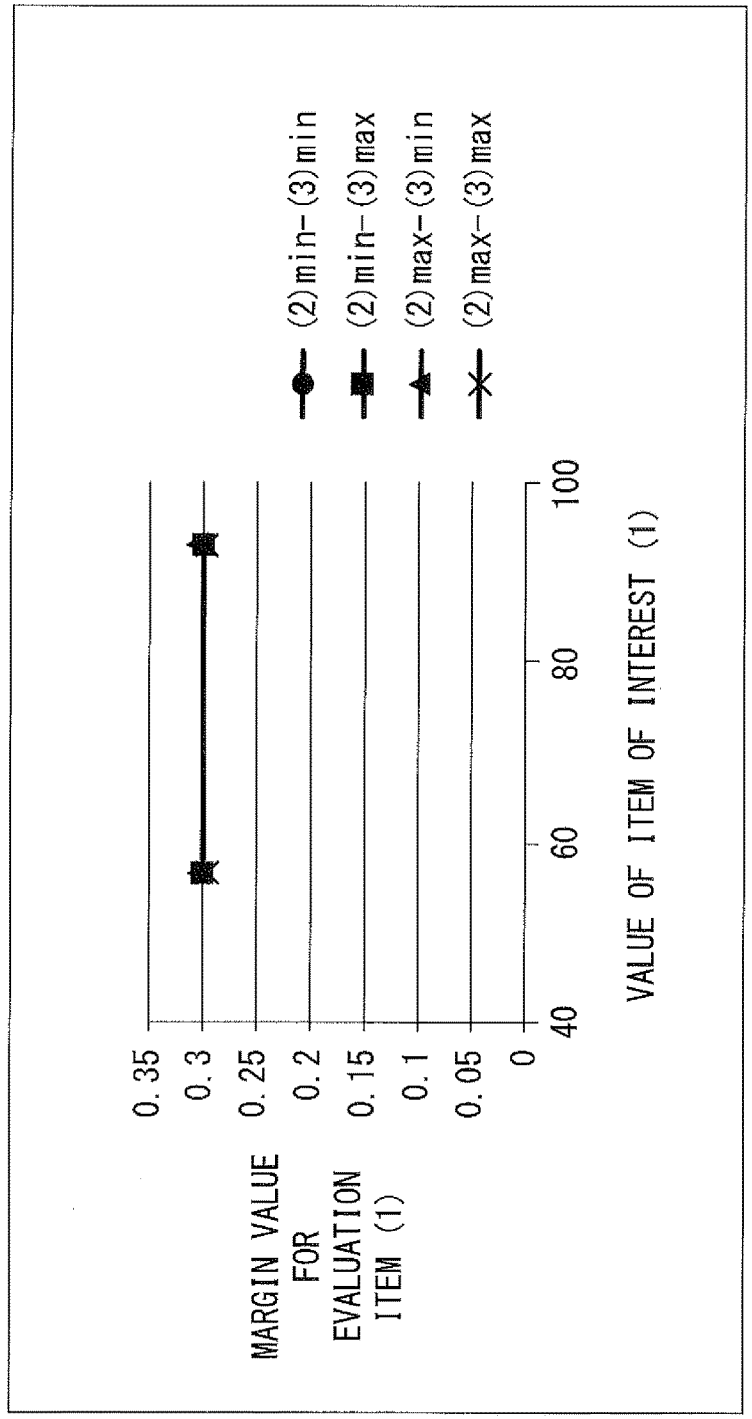
FIG. 19A is a margin value characteristic table and graph relating to an item of interest (1) and a margin value for an evaluation item (1).

FIG. 19A is a margin value characteristic table and graph relating to the item of interest (1) and the margin value for the evaluation item (1). The horizontal axis of the graph of FIG. 19A represents the item of interest (1), and the vertical axis represents the margin value for the evaluation item (1).

Figure 19B:
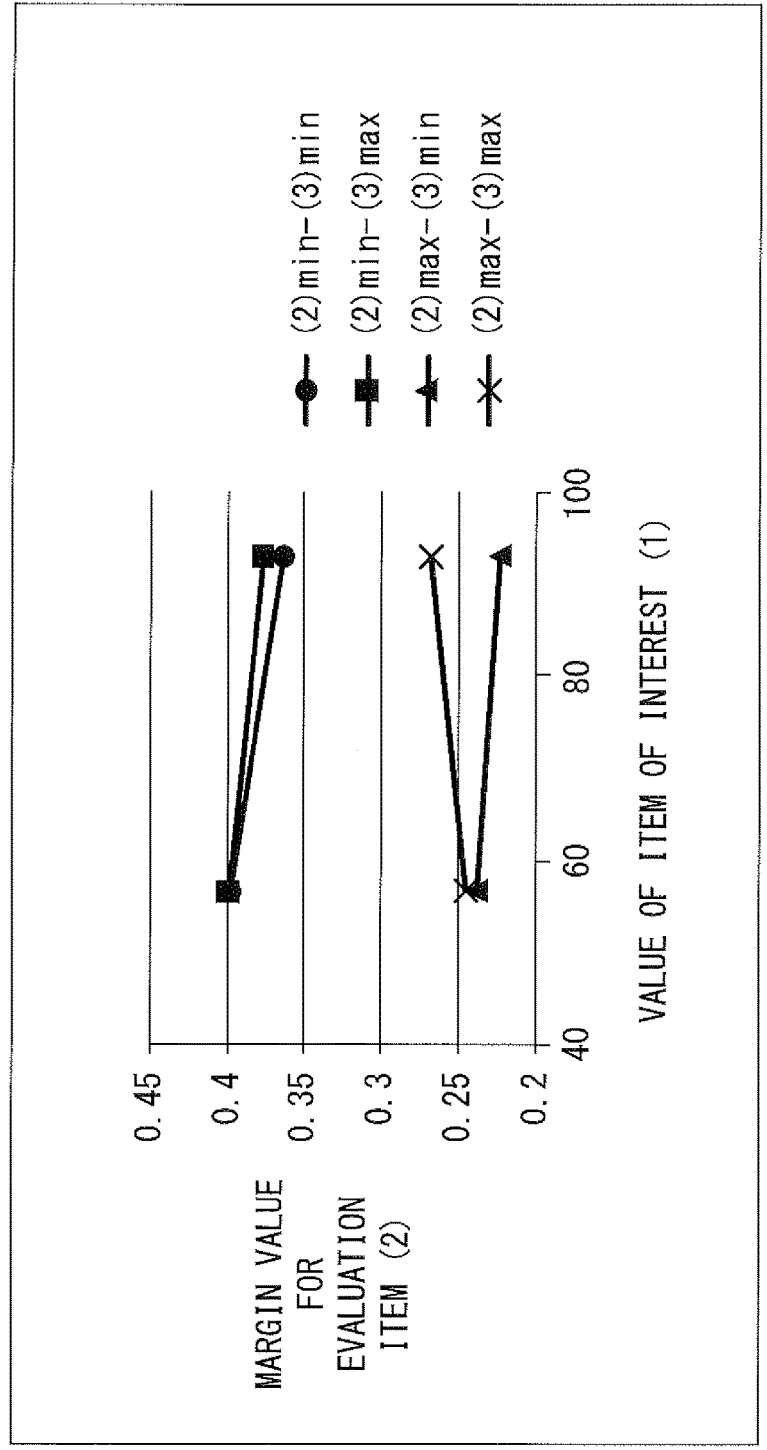
FIG. 19B is a margin value characteristic table and graph relating to an item of interest (1) and a margin value for an evaluation item (2).

FIG. 19B is a margin value characteristic table and graph relating to the item of interest (1) and the margin value for the evaluation item (2). The horizontal axis of the graph of FIG. 19B represents the item of interest (1), and the vertical axis represents the margin value for the evaluation item (2).

Figure 19C:
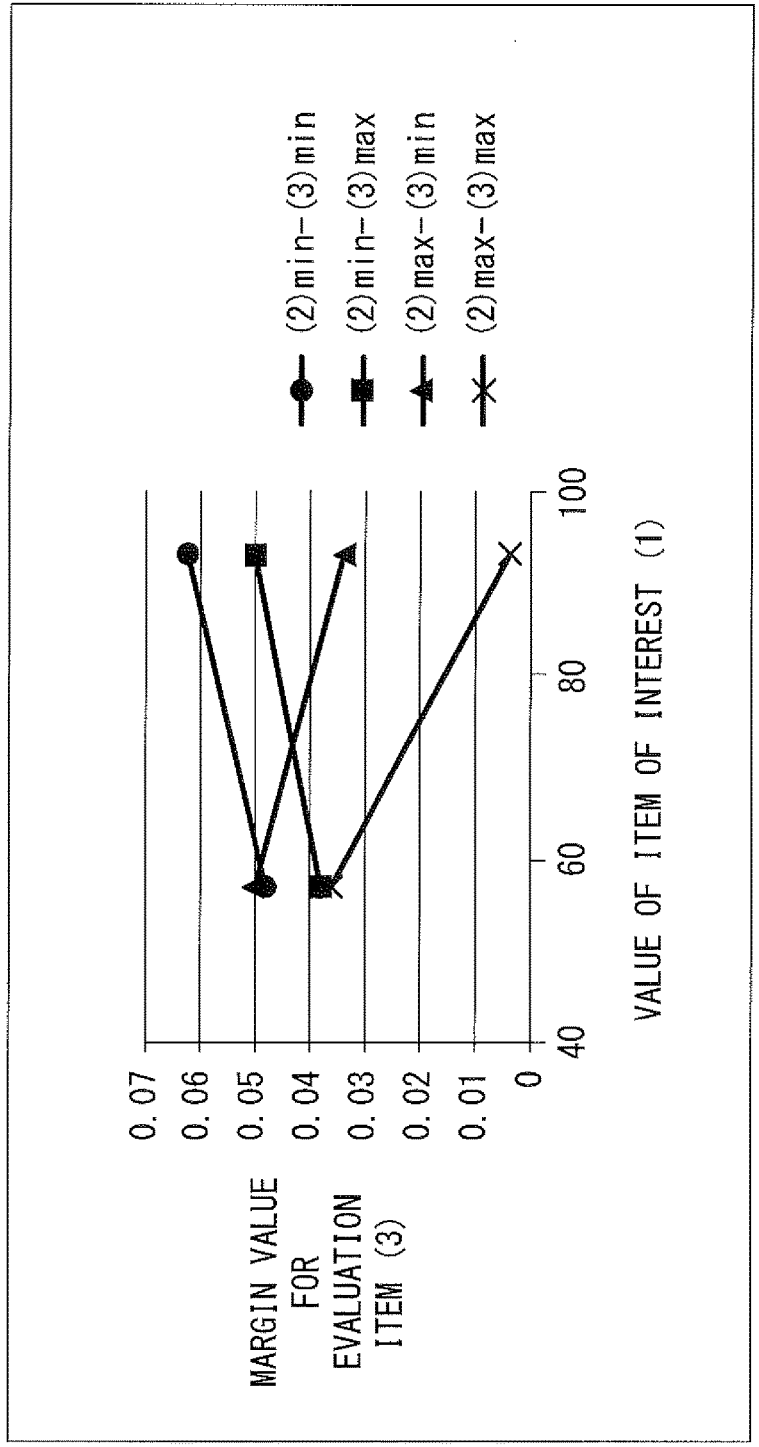
FIG. 19C is a margin value characteristic table and graph relating to an item of interest (1) and a margin value for an evaluation item (3).

FIG. 19C is a margin value characteristic table and graph relating to the item of interest (1) and the margin value by the evaluation item (3). The horizontal axis of the graph of FIG. 19C represents the item of interest (1), and the vertical axis represents the margin value for the evaluation item (3).

Figure 20A:
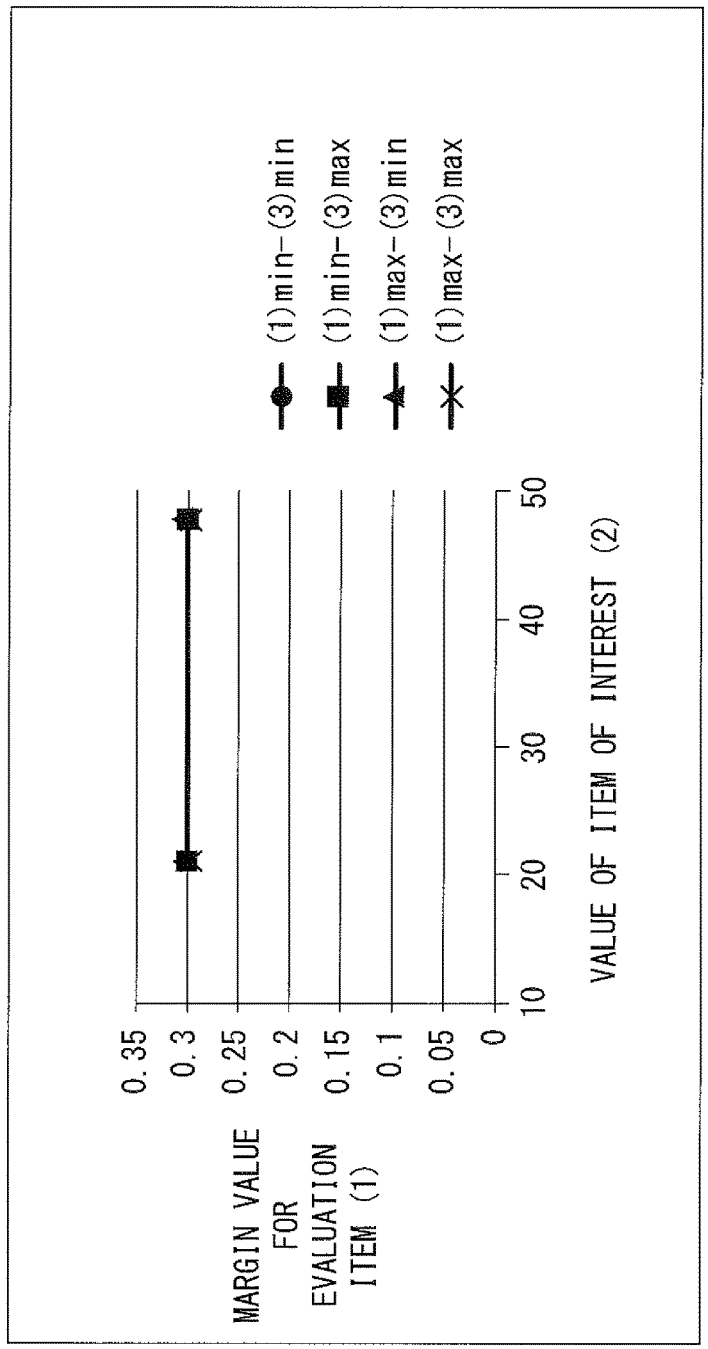
FIG. 20A is a margin value characteristic table and graph relating to an item of interest (2) and a margin value for an evaluation item (1).

FIG. 20A is a margin value characteristic table and graph relating to the item of interest (2) and the margin value for the evaluation item (1). The horizontal axis of the graph of FIG. 20A represents the item of interest (2), and the vertical axis represents the margin value for the evaluation item (1).

Figure 20B:
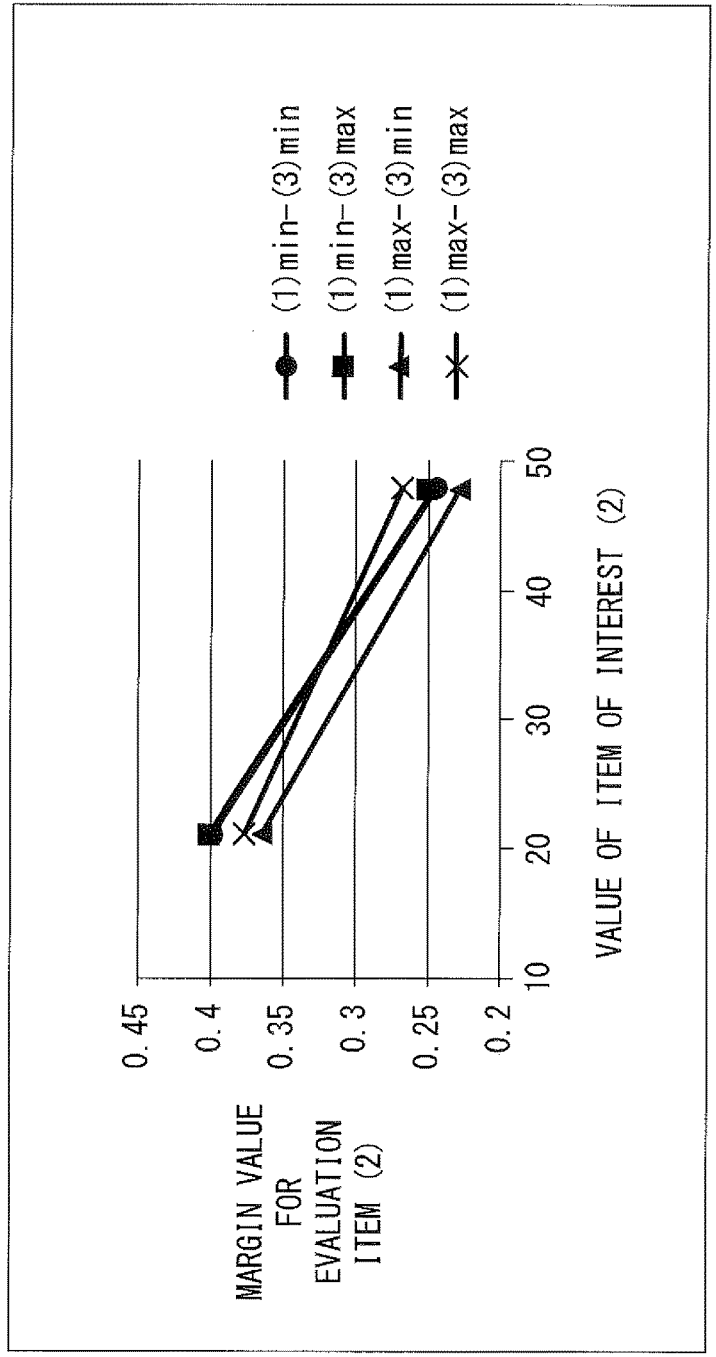
FIG. 20B is a margin value characteristic table and graph relating to an item of interest (2) and a margin value for an evaluation item (2).

FIG. 20B is a margin value characteristic table and graph relating to the item of interest (2) and the margin value for the evaluation item (2). The horizontal, axis of the graph of FIG. 20B represents the item of interest (2), and the vertical axis represents the margin value for the evaluation item (2).

Figure 20C:
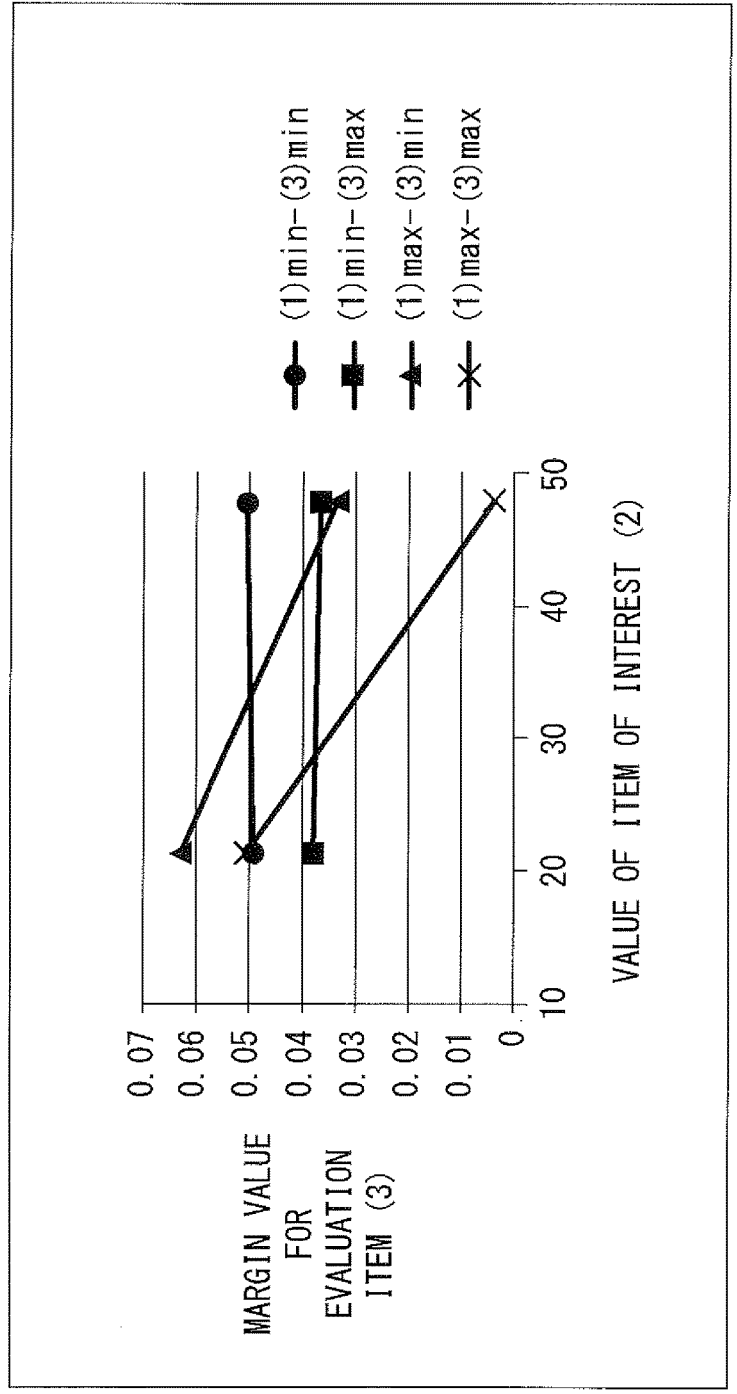
FIG. 20C is a margin value characteristic table and graph relating to an item of interest (2) and a margin value for an evaluation item (3).

FIG. 20C is a margin value characteristic table and graph relating to the item of interest (2) and the margin value for the evaluation item (3). The horizontal axis of the graph of FIG. 20C represents the item of interest (2), and the vertical axis represents the margin value for the evaluation item (3).

Figure 21A:
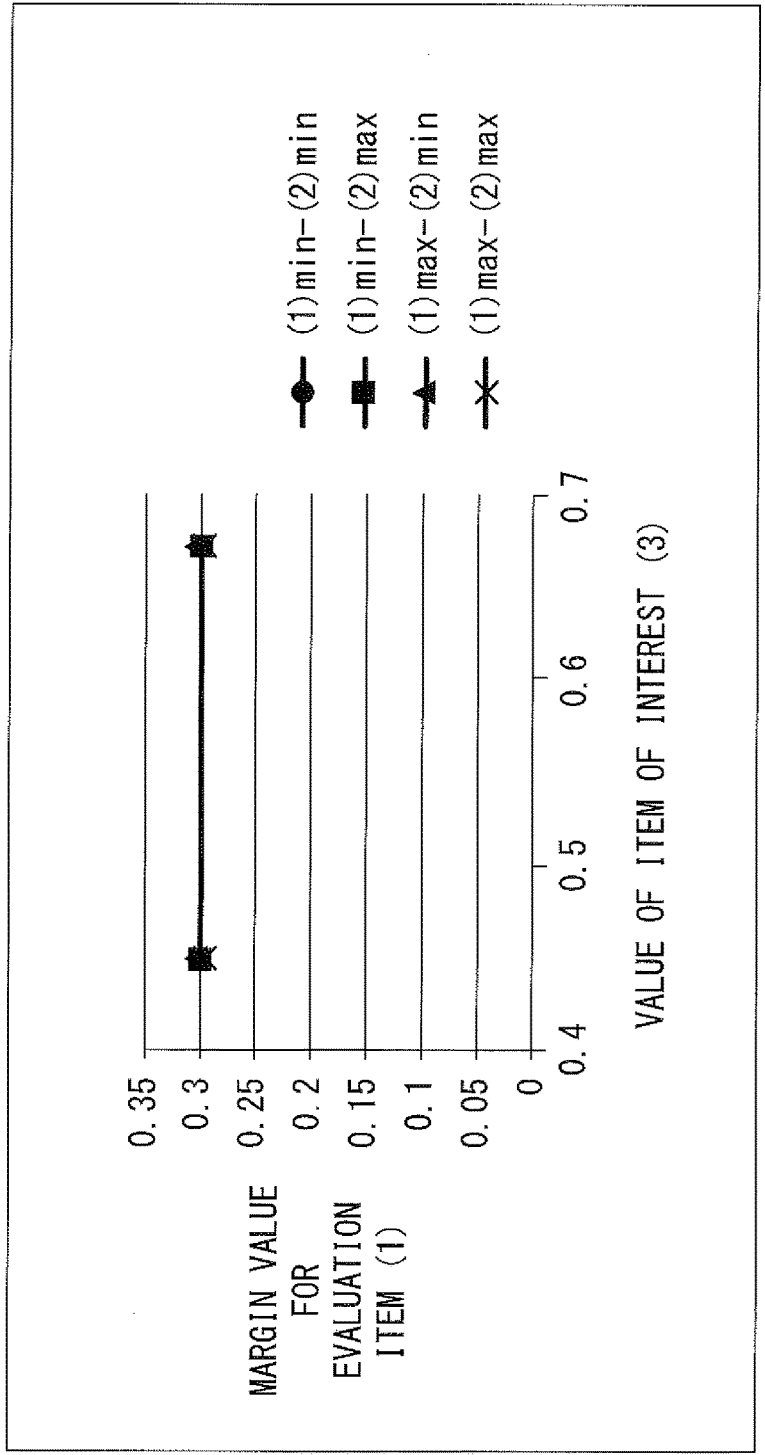
FIG. 21A is a margin value characteristic table and graph relating to an item of interest (3) and a margin value for an evaluation item (1).

FIG. 21A is a margin value characteristic table and graph relating to the item of interest (3) and the margin value for the evaluation item (1). The horizontal axis of the graph of FIG. 21A represents the item of interest (3), and the vertical axis represents the margin value for the evaluation item (1).

Figure 21B:
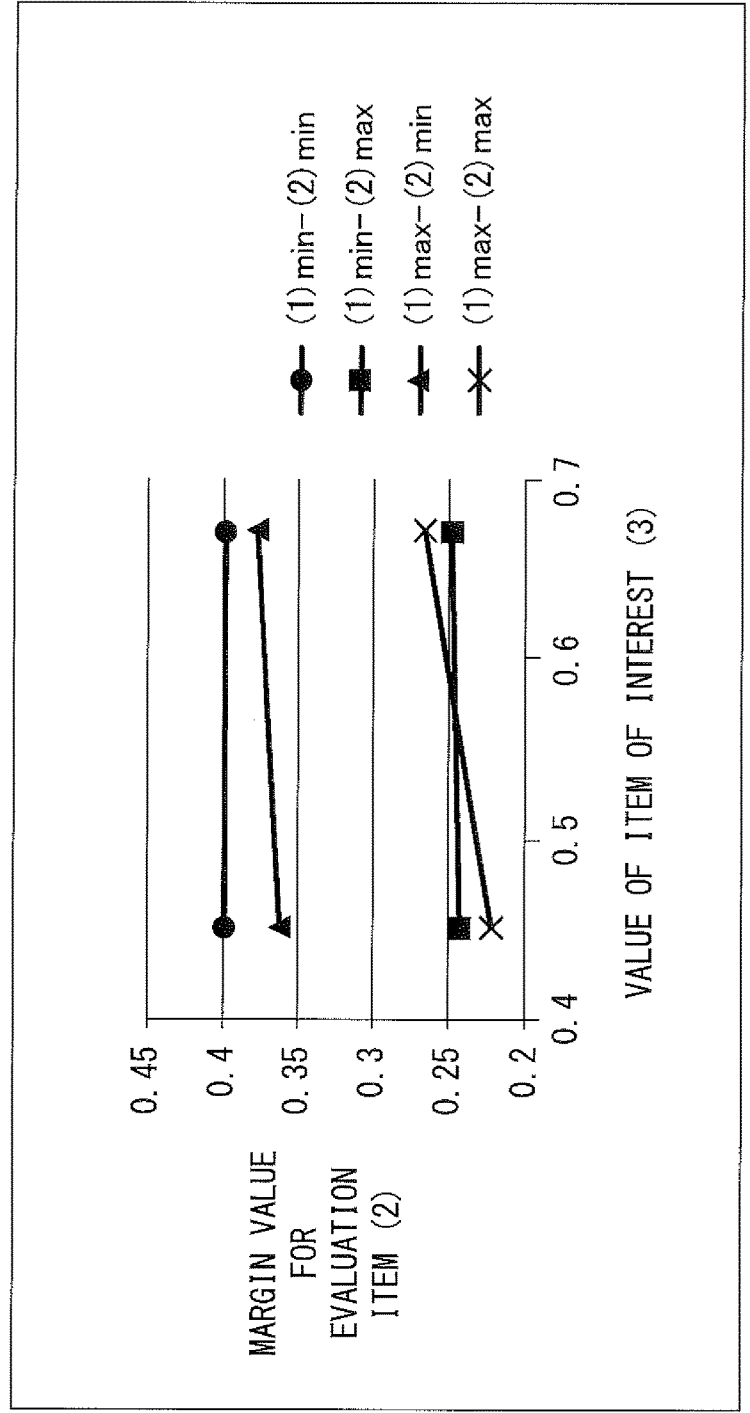
FIG. 21B is a margin value characteristic table and graph relating to an item of interest (3) and a margin value for an evaluation item (2).

FIG. 21B is a margin value characteristic table and graph relating to the item of interest (3) and the margin value for the evaluation item (2). The horizontal axis of the graph of FIG. 21B represents the item of interest (3), and the vertical axis represents the margin value for the evaluation item (2).

Figure 21C:
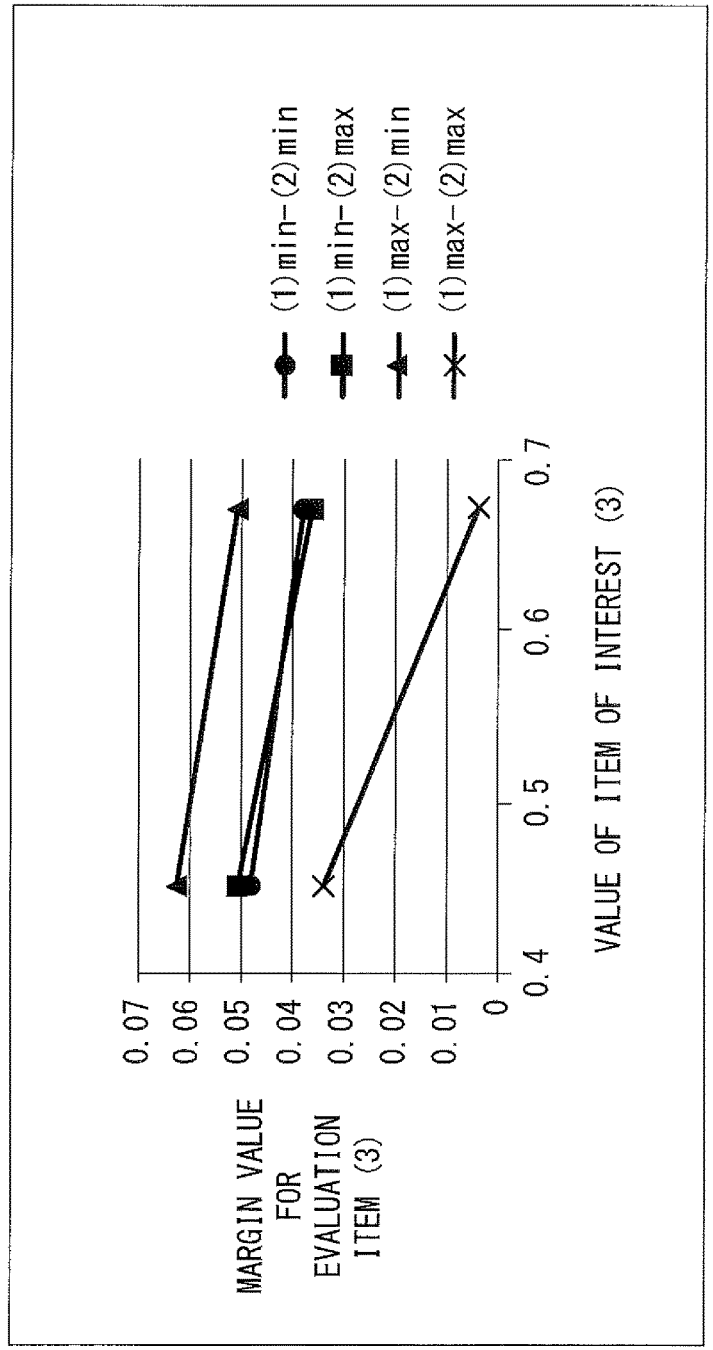
FIG. 21C is a margin value characteristic table and graph relating to an item of interest (3) and a margin value for an evaluation item (3).

FIG. 21C is a margin value characteristic table and graph relating to the item of interest (3) and the margin value for the evaluation item (3). The horizontal axis of the graph of FIG. 21C represents the item of interest (3), and the vertical axis represents the margin value for the evaluation item (3).

Here, a variable ni is set to 1.

In step S513, the calculating unit 14 calculates margin values for an evaluation item that respectively correspond to a maximum value and a minimum value of an item of interest in the ni-th IBIS model by using the characteristic table, and obtains a margin value used for a determination point on the basis of the calculated margin values for the evaluation item. Assume, that the IBIS model 20-$i$ is the i-th IBIS model.

A process of calculating the margin value used for the determination point is described below in detail.

Figure 22:
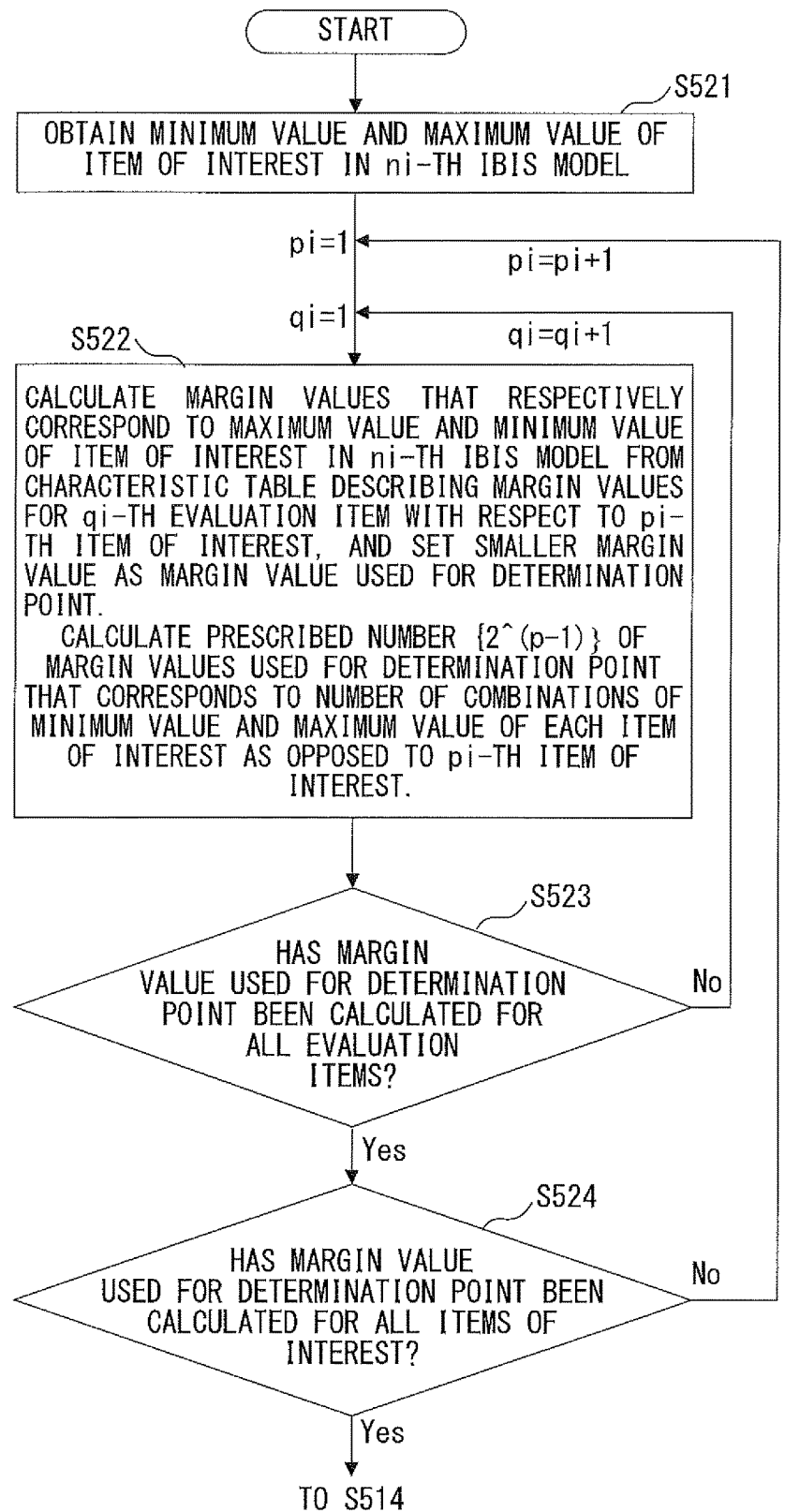
FIG. 22 is a flowchart illustrating details of a process of calculating a margin value used for a determination point according to an embodiment.

FIG. 22 is a flowchart illustrating details of a process of calculating a margin value used for a determination point according to the embodiments.

FIG. 22 corresponds to step S513.

In step S521, the calculating unit 14 obtains a maximum value and a minimum value of an item of interest in the ni-th IBIS model according to the extracted value 301 illustrated in FIG. 9. The calculating unit 14 sets variables pi and qi to 1.

In step S522, the calculating unit 14 calculates margin values for an evaluation item that respectively correspond to the maximum value and the minimum value of the item of interest in the ni-th IBIS model on the basis of a characteristic table relating to the pith item of interest and a margin value for the qi-th evaluation item. The calculating unit 14 then sets a smaller margin value for the evaluation item among the margin values of the evaluation items that respectively correspond to the maximum value and the minimum value as a margin value used for a determination point. A smaller margin value for evaluation is employed in order to perform determination in a worse case. The calculating unit. 14 calculates the prescribed number of margin values used for a determination point that corresponds to the number $\{2^{(p-1)}\}$ of combinations of the minimum value and the maximum value of each of the items of interest as opposed to the pi-th item of interest. Assume that the items of interest (1) to (3) are respectively the first to third items of interest. Also assume that the evaluation values (1) to (3) are respectively the first to third evaluation items.

An example of calculation of the margin value used for the determination point is described below.

In this example, a margin value used for a determination point for the IBIS model 20-1 with respect to the item of interest (1) and the margin value for the evaluation item (3) is calculated under a condition of a minimum value of the item of interest (2) and a minimum value of the item of interest (3).

Figure 23:
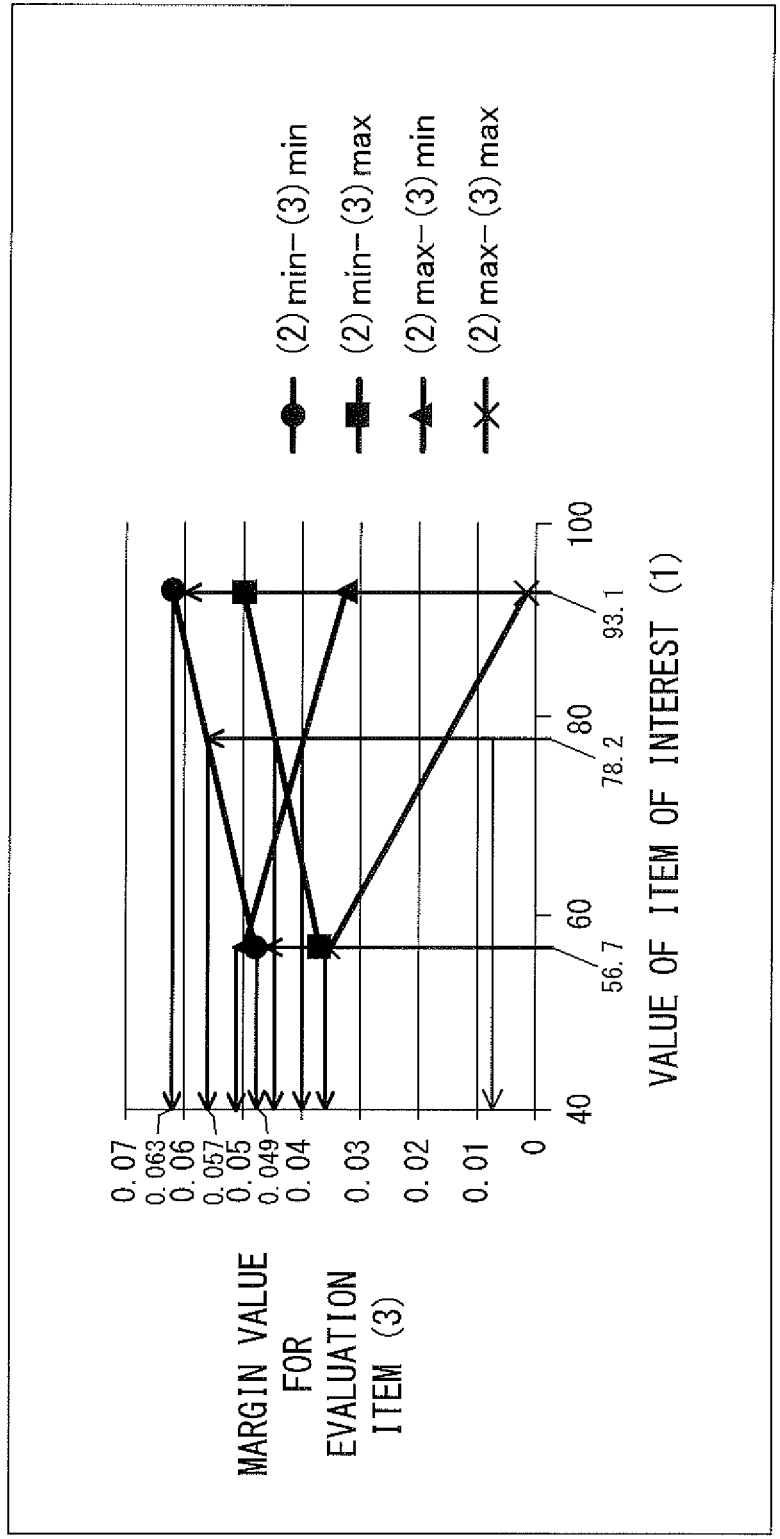
FIG. 23 is a diagram explaining a method for calculating a margin value used for a determination point.

FIG. 23 is a diagram explaining a method for calculating a margin value used for a determination point. FIG. 23 is the same graph as the graph of FIG. 19C relating to the item of interest (1) and the evaluation item (3).

First, in the IBIS model 21-1, margin values for the evaluation item (3) that respectively correspond to a minimum value and a maximum value of the item of interest (1) are obtained under the condition of a minimum value (min) of the item of interest (2) and a minimum value (min) of the item of interest (1).

An inclination α of a graph under the condition of a minimum value of the item of interest (2) and a minimum value of the item of interest (3) (a line connected between circles in the graph) is calculated by using the following expression.

$$\text{Inclination } \alpha = \{(\text{margin value when item of interest (1) has maximum value}) - (\text{margin value when item of interest (1) has minimum value})\} \div \{(\text{maximum value of item of interest (1)}) - (\text{minimum value of item of interest (1)})\}$$

Values are substituted in the above expression.

$$\alpha = \{0.063 - 0.049\} \div \{93.1 - 56.7\} = 0.014 \div 36.4 = 0.0003846$$

A margin value y when an arbitrary value x is substituted for the item of interest (1) is calculated by using the following expression.

$$y = \alpha \times \{x - (\text{minimum value of item of interest (1)})\} + (\text{margin value when item of interest (1) has minimum value})$$

As a result of the above calculation, a margin value for the item of interest (3) that corresponds to a minimum value of 56.7 of the item of interest (1) in the IBIS model 20-1 (XXXX.ibs) is 0.049, and a margin value for the item of interest (3) that corresponds to a maximum value of 78.2 of the item of interest (1) in the IBIS model 20-1 (XXXX.ibs) is 0.057.

A smaller value of these two margin values of the item of interest (3) is 0.049. Accordingly, a margin value used for a determination point is 0.049.

Similarly, a margin value used for a determination point is calculated under each of the following conditions:
When the item of interest (2) has a minimum value, and the item of interest (3) has a maximum value;
When the item of interest (2) has a maximum value, and the item of interest (3) has a minimum value; and
When the item of interest (2) has a maximum value, and the item of interest (3) has a maximum value.

For the IBIS model 20-1 (XXXX.ibs), the calculated margin values used for a determination point under the respective conditions are illustrated in FIG. 24.

In step S523, the calculating unit 14 determines whether a margin value used for a determination point has been calculated for all of the evaluation items with respect to the pi-th item of interest. When the margin value used for the deters point has been calculated for all of the evaluation items with respect to the pi-th item of interest, the variable qi is set to 1, and the control moves on to step S524. When the margin value used for the determination point has not been calculated for all of the evaluation items, the variable qi is incremented by 1, and the control returns to step S522.

In step S524, the calculating unit 14 determines whether a margin value used for a determination point has been calculated for all of the items of interest. When the margin value used for the determination point has been calculated for all of the items of interest, the control moves on to step S514. When the margin value used for the determination point has not been calculated for all of the evaluation items, the variable pi is incremented by 1, and the control returns to step S522.

Return now to the description of FIG. 12C.

In step S514, the calculating unit 14 calculates a ratio of the calculated margin value used for the determination point to a maximum margin value, calculates the score of the margin value used for the determination point when the maximum margin value is 100 points in each of the characteristic tables, by using the calculated ratio, and sets the calculated score as the determination point.

An example of the calculation of the determination point is described below.

As illustrated in FIG. 24, for the IBIS model 20-1 (XXXX.ibs), a margin value used for a determination point with respect to the item of interest (1) and the margin value for the evaluation item (3) under the condition of a minimum value (min) of the item of interest (2) and a minimum value (min) of the item of interest (3) is 0.049.

In the characteristic table of FIG. 19C, a maximum value of the margin value for the evaluation item (3) is 0.063. When 0.083 is 100 points, for the IBIS model 21-1, a determination point with respect to the item of interest (1) and the margin value for the evaluation item (3) under the condition of a minimum value of the item of interest (2) and a minimum value of the item of interest (3) is 78 (=0.049/0.063×100) points. Similarly, when determination points under the respective conditions are calculated, the calculated determination points under the respective conditions for the IBIS model 21-1 (XXXX.ibs) are as illustrated in FIG. 25. The calculating unit 14 may calculate the determination point by multiplying each of the margin values for the evaluation item by a prescribed coefficient (weighting).

In step S515, the calculating unit 14 determines whether the determination point has been calculated for all of the IBIS models. When the determination point has been calculate for all of the IBIS models, the control moves on to step S518. When the determination point has not been calculated for all of the IBIS models, ni is incremented by 1, and the control returns to step S513.

In step S516, the ranking unit 15 calculates the sum of determination points for each of the IBIS models 21-i, and ranks the IBIS models 21-i in descending order of the sum. As an example, the sum of determination points for the IBIS model 21-1 (XXXX.ibs) is calculated by adding up the determination points under the respective conditions illustrated in FIG. 25.

The sum of determination points and a rank of each of the IBIS models is illustrated in FIG. 26. As illustrated in FIG. 26, the sum of the determination points for the IBIS model 21-1 (XXXX.ibs) is 2723, the sum of the determination points or the IBIS model 21-2 (YYYY.ibs) is 2838, and the sum of the determination points for the IBIS model 21-3 (ZZZZ.ibs) is 2798. Accordingly, the IBIS model 21-1 (XXXX.ibs) ranks third, the IBIS model 21-2 (YYYY.ibs) ranks first, and the IBIS model 21-3 (ZZZZ.ibs) ranks second.

The ranking unit 15 reports the rank of the IBIS model 21-i to a user. In order to manufacture a product having fewer malfunctions, the user selects an element that corresponds to the IBIS model 21-2 (YYYY.ibs) having the largest sum of the determination points (i.e., the IBIS model that ranks first).

The simulation device according to the embodiments enables the objective ranking of a plurality of IBIS models based on margin values. As a result, a user can select an element having fewer malfunctions.

Figure 27:
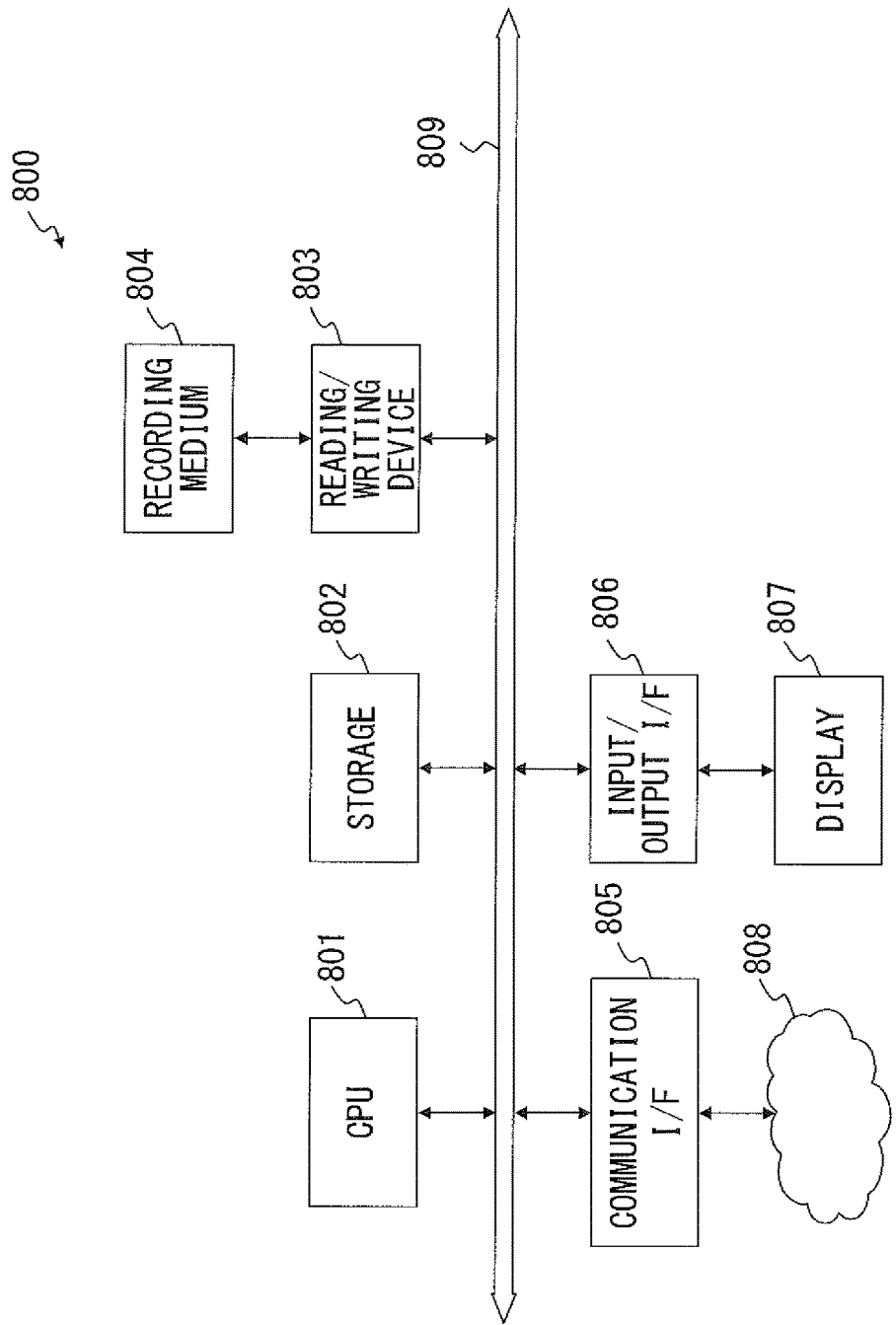
FIG. 27 illustrates a configuration of an information processing device (computer).

FIG. 27 illustrates a configuration of an information processing device (a computer).

The simulation device 1 can be implemented by using the information processing device (computer) as illustrated in FIG. 27.

An information processing device 800 includes a CPU 801, a storage 802, a reading/writing device 803, a recording medium 804, a communication interface (communication I/F) 805, an input/output interface (input/output I/F) 806, a display 807, and a network 808. Respective components are connected via a bus 809.

The CPU 801 controls the entirety of the information processing device 800. The CPU 801 functions, for example, as the processing unit 10 in FIG. 1. The calculated values 121-1 to 121-3 and the extracted value 301 obtained by the simulation device 1 may be stored, for example, in a cache of the CPU. The IBIS model 21-i and the IBIS model for verification 22 stared in the storage 20 may be stored, for example, in the cache of the CPU.

The storage 802 stores various pieces of data. The storage 802 is configured, for example, of a memory such as a Read Only Memory (ROM) and a Random Access Memory (RAM), or a Hard Disk Drive (HDD). The storage 802 functions, for example, as the storage 20 in FIG. 1.

The storage 802 stores, for example, a program for causing the CPU 801 to function as the processing unit 10.

In the ranking process, the CPU 801 reads the program stored in the storage 802 onto the RAM. The CPU 801 executes the program read onto the RAM so as to perform the ranking process.

The program may be stored in a storage included in a server on the network 808 if the CPU 801 can access the program via the communication interface 805.

The reading/writing device 803 is controlled by a control circuit 801 so as to read/write data from/to a removable recording medium 804. Examples of the reading/writing device 803 include a Flexible Disk Drive (FDD), a Compact Disc Drive (CDD), a Digital Versatile Disk Drive (DVDD), Blu-ray (registered trademark) Disk Drive (BDD), and a Universal Serial Bus (USB).

The recording medium 804 stores various pieces of data. The recording medium 804 stores, for example, a program. The recording medium 804 may store the IBIS model 21-*i* and the IBIS model for verification 22 illustrated in FIG. 1.

The recording medium 804 is connected to the bus 809 via the reading/writing device 803, and the CPU 801 controls the reading/writing device 803 so as to read/write data. Examples of the recording medium 804 include a Flexible Disk (FD), a Compact Disc Read Only Memory (CD-ROM), a Digital Versatile Disk Read Only Memory (DVD-ROM), and a flash memory.

The communication interface 80 communicably connects the information processing device 800 and other devices via the network 808.

The input/output interface 806 is connected, for example, to a keyboard, a mouse, a touch panel, and the like, and when signals indicating various types of information are input from the connected devices, the input/output interface 806 outputs the input signals to the control circuit 801 via the bus 809. When signals output from the CPU 801 that indicate various types of information are input via the bus 809, the input/output interface 806 outputs the signals to the various connected devices. The input/output interface 806 may receive, for example, the input of the IBIS model 21-*i* and the IBIS model for verification 22 stored in the storage 20 of FIG. 1. The input/output interface 806 functions, for example, as the input/output unit 30 in FIG. 1.

The display 807 is connected, for example, to the input/output interface 806, and displays various types of information. The display 807 may display, for example, the IBIS model 21-*i* and the IBIS model for verification 22 output from the CPU 801.

The network 808 is, for example, a LAN, wireless communication, the Internet, or the like, and communicably connects the information processing device 800 and other devices.

All examples and conditional language provided herein are intended for pedagogical purposes to aiding the reader in understanding the invention and the concepts contributed by the inventor to further the art, and are not to be construed as being limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a program for causing a computer to execute a process comprising:
   generating a second I/O Buffer Information Specification (IBIS) characteristic model from a plurality of first IBIS characteristic models by using a maximum value and a minimum value from among maximum values and minimum values of a prescribed parameter in the respective plurality of first IBIS characteristic models, the plurality of first IBIS characteristic models respectively describing electric characteristics of a plurality of semiconductor components, the electric characteristics comprising receiver input capacitance, driver output current voltage, and driver ramp rate;
   simulating an electric transmission line by using the second IBIS characteristic model;
   calculating a plurality of first margins for an evaluation item according to a result of the simulating;
   calculating a plurality of second margins for the evaluation item with respect to each of the first IBIS characteristic models by using a maximum value and a minimum value of the prescribed parameter in each of the plurality of first IBIS characteristic models;
   calculating a ratio of each of the plurality of second margins to a maximum margin of the plurality of first margins;
   ranking the plurality of first IBIS characteristic models according to the ratio; and
   selecting a first IBIS characteristic model, from among the plurality of first IBIS characteristic models, that is first in the ranking, the first IBIS characteristic model corresponding to one of the plurality of semiconductor components to be used for manufacturing a product having fewer malfunctions.

2. The non-transitory computer-readable recording medium according to claim 1, wherein the calculating the plurality of second margins calculates a margin for the evaluation item with respect to the maximum value of the prescribed parameter in each of the plurality of first characteristic models, and a margin for the evaluation item with respect to the minimum value of the prescribed parameter in each of the first characteristic models, and sets a smaller margin from among the margin for the evaluation item with respect to the maximum value of the prescribed parameter in each of the plurality of first characteristic models, and the margin for the evaluation item with respect to the minimum value of the prescribed parameter in each of the first characteristic models, as each of the plurality of second margins for each of the plurality of first characteristic models.

3. The non-transitory computer-readable recording medium according to claim 1, wherein the executing simulation executes simulation by using, as a condition, the maximum value from among the maximum values of the prescribed parameter in the respective plurality of first characteristic models, and the minimum value from among the minimum values of the prescribed parameter in the respective plurality of first characteristic models.

4. A ranking method performed by an information processing device, the ranking method comprising:
   generating, by a processor, a second I/O Buffer Information Specification (IBIS) characteristic model from a plurality of first IBIS characteristic models by using a maximum value and a minimum value from among maximum values and minimum values of a prescribed parameter in the respective plurality of first IBIS characteristic models, the plurality of first IBIS characteristic models respectively describing electric characteristics of a plurality of semiconductor components, the electric characteristics comprising receiver input capacitance, driver output current voltage, and driver ramp rate;

simulating, by the processor, an electric transmission line by using the second IBIS characteristic model;

calculating, by the processor, a plurality of first margins for an evaluation item according to a result of the simulating;

calculating, by the processor, a plurality of second margins for the evaluation item with respect to each of the first IBIS characteristic models by using a maximum value and a minimum value of the prescribed parameter in each of the plurality of first IBIS characteristic models;

calculating, by the processor, a ratio of each of the plurality of second margins to a maximum margin of the plurality of first margins;

ranking, by the processor, the plurality of first IBIS characteristic models according to the ratio; and selecting a first IBIS characteristic model, from among the plurality of first IBIS characteristic models, that is first in the ranking, the first IBIS characteristic model corresponding to one of the plurality of semiconductor components to be used for manufacturing a product having fewer malfunctions.

5. The ranking method according to claim 4, wherein the calculating the plurality of second margins calculates a margin for the evaluation item with respect to the maximum value of the prescribed parameter in each of the plurality of first characteristic models, and a margin for the evaluation item with respect to the minimum value of the prescribed parameter in each of the first characteristic models, and sets a smaller margin from among the margin for the evaluation item with respect to the maximum value of the prescribed parameter in each of the plurality of first characteristic models, and the margin for the evaluation item with respect to the minimum value of the prescribed parameter in each of the first characteristic models, as each of the plurality of second margins for each of the plurality of first characteristic models.

6. The ranking method according to claim 4, wherein the executing simulation executes simulation by using, as a condition, the maximum value from among the maximum values of the prescribed parameter in the respective plurality of first characteristic models, and the minimum value from among the minimum values of the prescribed parameter in the respective plurality of first characteristic models.

7. An information processing device comprising:
a processor that:
generates a second I/O Buffer Information Specification (IBIS) characteristic model from a plurality of first IBIS characteristic models by using a maximum value and a minimum value from among maximum values and minimum values of a prescribed parameter in the respective plurality of first IBIS characteristic models, the plurality of first IBIS characteristic models respectively describing electric characteristics of a plurality of semiconductor components, the electric characteristics comprising receiver input capacitance, driver output current voltage, and driver ramp rate;

simulating an electric transmission line by using the second IBIS characteristic model;

calculates a plurality of first margins for an evaluation item according to a result of the simulating;

calculates a plurality of second margins for the evaluation item with respect to each of the first IBIS characteristic models by using a maximum value and a minimum value of the prescribed parameter in each of the plurality of first IBIS characteristic models;

calculates a ratio of each of the plurality of second margins to a maximum margin of the plurality of first margins;

ranks the plurality of first IBIS characteristic models according to the ratio; and selecting a first IBIS characteristic model, from among the plurality of first IBIS characteristic models, that is first in the ranking, the first IBIS characteristic model corresponding to one of the plurality of semiconductor components to be used for manufacturing a product having fewer malfunctions.

8. The information processing device according to claim 7, wherein the processor calculates a margin for the evaluation item with respect to the maximum value of the prescribed parameter in each of the plurality of first characteristic models, and a margin for the evaluation item with respect to the minimum value of the prescribed parameter in each of the first characteristic models, and sets a smaller margin from among the margin for the evaluation item with respect to the maximum value of the prescribed parameter in each of the plurality of first characteristic models, and the margin for the evaluation item with respect to the minimum value of the prescribed parameter in each of the first characteristic models, as each of the plurality of second margins for each of the plurality of first characteristic models.

9. The information processing device according to claim 7, wherein the processor executes simulation by using, as a condition, the maximum value from among the maximum values of the prescribed parameter in the respective plurality of first characteristic models, and the minimum value from among the minimum values of the prescribed parameter in the respective plurality of first characteristic models.

* * * * *